(12) United States Patent
Haraguchi et al.

(10) Patent No.: US 8,975,657 B2
(45) Date of Patent: Mar. 10, 2015

(54) PACKAGE FOR SEMICONDUCTOR LIGHT-EMITTING DEVICE AND LIGHT-EMITTING DEVICE

(71) Applicant: Mitsubishi Chemical Corporation, Chiyoda-ku (JP)

(72) Inventors: Yukinari Haraguchi, Kitakyushu (JP); Takeshi Otsu, Yokohama (JP); Yutaka Mori, Kitakyushu (JP); Tadahiro Katsumoto, Yokohama (JP)

(73) Assignee: Mitsubishi Chemical Corporation, Chiyoda-ky ( * ) Notice: Subject to any disclaimer, the term of this patent is extended or adjusted under 35 U.S.C. 154(b) by 192 days.

(21) Appl. No.: 13/665,696

(22) Filed: Oct. 31, 2012

(65) Prior Publication Data

US 2013/0056788 A1  Mar. 7, 2013

Related U.S. Application Data

(63) Continuation of application No. PCT/JP2011/060326, filed on Apr. 27, 2011.

(30) Foreign Application Priority Data

Apr. 28, 2010  (JP) ................................. 2010-104490

(51) Int. Cl.
*H01L 33/00* (2010.01)
*H01L 33/48* (2010.01)
*H01L 23/00* (2006.01)

(52) U.S. Cl.
CPC ............... *H01L 33/486* (2013.01); *H01L 33/48* (2013.01); *H01L 2224/48091* (2013.01);

(Continued)

(58) Field of Classification Search
CPC . H01L 23/296; H01L 31/048; H01L 31/0481; C08G 77/38; C09J 183/10
USPC ............ 257/99, 100, 101, 701, 702, E33.059, 257/E33.066; 438/106, 124, 127
See application file for complete search history.

(56) References Cited

U.S. PATENT DOCUMENTS 7,772,594 B2 *  8/2010  Sugawara et al. ............... 257/76
7,859,006 B2 * 12/2010  Kato et al. ..................... 257/100

(Continued)

FOREIGN PATENT DOCUMENTS

| JP | 2002-283498 | 10/2002 |
| JP | 2004-288937 | 10/2004 |

(Continued)

OTHER PUBLICATIONS

International Search Report issued May 31, 2011 in Application No. PCT/JP2011/060326.

(Continued)

*Primary Examiner* — Fernando L Toledo
*Assistant Examiner* — Victoria K Hall
(74) *Attorney, Agent, or Firm* — Oblon, McClelland, Maier & Neustadt, L.L.P.

(57) ABSTRACT

An object of the present invention is to provide a package from which a metal wiring and the like are difficult to be detached even when heat is generated from a semiconductor light-emitting element. This object is achieved with a package for a semiconductor light-emitting device comprising at least a molded resin containing (A) a SiH-containing polyorganosiloxane and (B) a filler, wherein an amount of SiH existing in the molded resin, after a heat treatment thereof at 200° C. for 10 minutes, is 20 to 65 μmol/g.

10 Claims, 10 Drawing Sheets

(52) U.S. Cl.
 CPC ............... *H01L 2224/49107* (2013.01); *H01L 2224/45144* (2013.01); *H01L 2924/10253* (2013.01); *H01L 2924/3025* (2013.01); *H01L 24/45* (2013.01)
 USPC ....... 257/99; 257/100; 257/788; 257/E33.059

(56) References Cited

U.S. PATENT DOCUMENTS

| | | | |
|---|---|---|---|
| 7,928,457 B2 * | 4/2011 | Kato et al. | 257/98 |
| 8,502,364 B2 * | 8/2013 | Kato et al. | 257/678 |
| 8,629,222 B2 * | 1/2014 | Takizawa et al. | 525/478 |
| 8,759,840 B2 * | 6/2014 | Kato et al. | 257/79 |
| 2002/0132108 A1 | 9/2002 | Ikegawa et al. | |
| 2008/0160322 A1 | 7/2008 | Mochizuki et al. | |
| 2009/0171013 A1 | 7/2009 | Taguchi et al. | |
| 2011/0058776 A1 | 3/2011 | Taniguchi et al. | |

FOREIGN PATENT DOCUMENTS

| | | |
|---|---|---|
| JP | 2005-146191 | 6/2005 |
| JP | 2007-116128 | 5/2007 |
| JP | 2009-155415 | 7/2009 |
| JP | 2011-42732 | 3/2011 |
| JP | 2011-74355 | 4/2011 |
| WO | WO 2006/077667 A1 | 7/2006 |

OTHER PUBLICATIONS

International Preliminary Report on Patentability and Written Opinion issued Dec. 20, 2012 in PCT/JP2011/060326.

* cited by examiner

PACKAGE FOR SEMICONDUCTOR LIGHT-EMITTING DEVICE AND LIGHT-EMITTING DEVICE

CROSS-REFERENCE TO RELATED APPLICATIONS

This is a continuation of International Application PCT/JP2011/060326, filed on Apr. 27, 2011, and designated the U.S., (and claims priority from Japanese Patent Application 2010-104490 which was filed on Apr. 28, 2010) the entire contents of which are incorporated herein by reference.

TECHNICAL FIELD

The present invention relates to a package used for a semiconductor light-emitting device including an optical device, particularly a light-emitting element such as a light-emitting diode, and a light-emitting device.

BACKGROUND ART

A semiconductor light-emitting device including a semiconductor light-emitting element is, as shown in FIG. 1, formed by the semiconductor light-emitting element 1, a molded resin 2, a bonding wire 3, a phosphor layer 4, a lead frame 5 and the like. A package includes mainly a conductive metal wiring such as the lead frame 5 and the insulating molded resin 2.

Conventionally, thermoplastic resins such as polyamides to which a white pigment is added has been generally used as insulating materials for molded resins (refer, for example, to Patent Document 1). Light-emitting efficiency of semiconductor light-emitting devices which are desired to have directionality of emitted light is improved not only by the light which is emitted in the desired direction from the semiconductor light-emitting element, but also by causing light emitted in other directions to be reflected by molded resins, metal wirings such as lead frames and reflecting materials into the desired direction. Thermoplastic resins such as polyamides are translucent. Therefore, when a molded resin is used for reflection, the resin is mixed with a white pigment, so that light generated from a semiconductor light-emitting element can be reflected due to the difference in refractive index between the resin and the white pigment and light-emitting efficiency of the semiconductor light-emitting device can be improved.

In the above Patent Document 1, because some white pigments have insufficient reflection efficiency, some light beams are absorbed or transmitted. As a result, light generated from a semiconductor light-emitting element cannot be concentrated in a desired direction, thereby sometimes decreasing efficiency of the semiconductor light-emitting device.

In addition, there is currently a trend toward higher reflow temperatures due to a strong trend toward the use of higher melting lead-free solders brought on by environmental concerns. Polyamides are thermoplastic resins, and polyamides are thus softened by this heat and the heat resistance of the package then becomes a problem in the case of packages that use polyamide. Furthermore, polyamides are subject to photodegradation and thermal degradation by ultraviolet radiation and heat, and degradation by light has become a problem in particular when light-emitting elements are used that have a light-emission range that extends into high-energy wavelength regions, such as the blue to near-ultraviolet semiconductor light-emitting elements whose commercialization has been ongoing in the recent years. Moreover, thermal degradation and photodegradation have become even more significant problems due to the heat and high luminous flux light generated by the semiconductor light-emitting element as a result of contemporary demands for brighter light-emitting elements.

Otherwise, an alumina-containing sintered ceramic may be used as the insulating material in those cases in which heat resistance is required (refer, for example, to Patent Document 2). A package that uses this ceramic does have a good heat resistance, but its production requires a high-temperature sintering step post-molding. These sintering steps have involved problems such that costs are high due to electricity costs and the like, and mass-productivity is low as defective products are likely to be produced due to changes in the size and shape of molded products in each sintering.

In contrast to the preceding, a case has also recently been introduced that is provided by molding a silicone resin composition that uses a polyorganosiloxane for the resin and uses titanium oxide for the white pigment (refer, for example, to Patent Document 3). The use of the polyorganosiloxane for the resin is intended to improve the heat resistance over that for the use of polyamide.

Patent Document 1: Japanese Patent Application Laid-open No. 2002-283498
Patent Document 2: Japanese Patent Application Laid-open No. 2004-288937
Patent Document 3: Japanese Patent Application Laid-open No. 2009-155415

DISCLOSURE OF THE INVENTION

Semiconductor light-emitting devices generate heat from semiconductor light-emitting elements and the amount of heat generated is increased when particularly brighter light-emitting elements are desired. Due to this requirement, an unaddressed problem has been emerged such that the molded resin which forms the package of the semiconductor light-emitting device is expanded due to heat generated from the semiconductor light-emitting element and therefore a metal wiring or encapsulant is liable to be detached from the resin material. This phenomenon is significant particularly when the resin material is made of a silicone resin.

In addition, there is another problem that the package made of a silicone resin may be discolored during prolonged use, thereby causing reduction in reflectivity.

The present invention is to address these problems. Thus, an object of the present invention is to provide a package which is not discolored during prolonged use so as to maintain high reflectivity and from which a metal wiring and the like are difficult to be detached even when heat is generated from a semiconductor light-emitting element.

As a result of extensive studies by the present inventors in order to achieve the above object, they have found that the above object can be achieved by providing a certain amount of SiH in a molded resin forming a package.

Thus, the present invention provides the followings:
(1) a package for a semiconductor light-emitting device including at least a molded resin containing (A) a SiH-containing polyorganosiloxane and (B) a filler, this package being characterized in that an amount of SiH existing in the molded resin, after a heat treatment thereof at 200° C. for 10 minutes, is 20 to 65 µmol/g;
(2) the package for a semiconductor light-emitting device according to (1), characterized in that the package further comprises a metal wiring and at least a part of the metal wiring contacts the molded resin;

(3) the package for a semiconductor light-emitting device according to (1) or (2), characterized in that the molded resin has, at a thickness of 0.5 mm, a reflectivity of 60% or higher for light at a wavelength of 460 nm;

(4) the package for a semiconductor light-emitting device according to any of (1) to (3), characterized in that the molded resin has, at a thickness of 0.5 mm, a reflectivity of 60% or higher for light at a wavelength of 400 nm;

(5) the package for a semiconductor light-emitting device according to any of (1) to (4), characterized in that the filler (B) comprises alumina and/or titania;

(6) the package for a semiconductor light-emitting device according to (5), characterized in that the filler (B) has a primary particle diameter of 0.1 μm or more and 2 μm or less, and an aspect ratio of primary particles thereof is 1.0 or more and 4.0 or less;

(7) the package for a semiconductor light-emitting device according to any of (1) to (6), characterized in that the SiH-containing polyorganosiloxane (A) is obtained by mixing a SiH-containing organosilicic compound and a Si(CHCH$_2$)-containing organosilicic compound so as to obtain an equivalent ratio of SiH and Si(CHCH$_2$), SiH/Si(CHCH$_2$), of 0.9 to 2.5;

(8) a package for a semiconductor light-emitting device including at least a molded resin containing (A) a SiH-containing polyorganosiloxane and (B) a filler, the package being characterized in that an amount of SiH existing in the molded resin is 30 to 120 μmol/g;

(9) a semiconductor light-emitting device comprising at least a semiconductor light-emitting element, the package according to any of (1) to (8) and an encapsulant; and

(10) the semiconductor light-emitting device according to (9), characterized in that a difference in reflectivity between a binder resin used in the molded resin and the encapsulant is 0.05 or less.

The filler (B) is preferably alumina.

Another aspect of the present invention is a semiconductor light-emitting device including at least a semiconductor light-emitting element, the package described above and an encapsulant.

According to a preferred mode, the reflectivity of the encapsulant is the same or higher than the reflectivity of the binder resin used in the molded resin.

According to a preferred mode, the semiconductor light-emitting device comprises a phosphor layer containing a phosphor and the distance between the semiconductor light-emitting element and the phosphor is 0.1 mm or more and 5 mm or less.

According to the present invention, the package can be provided from which a metal wiring and the like are difficult to be detached even when heat is generated from the semiconductor light-emitting element.

BEST MODE FOR CARRYING OUT THE INVENTION

1. Molded Resin

Figure 1:
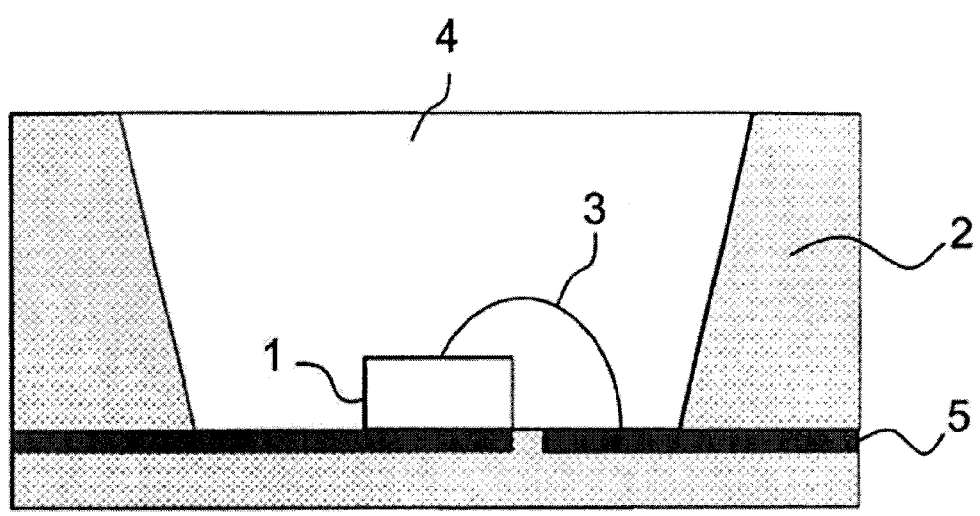
FIG. 1 is a conceptual diagram showing one mode of a semiconductor light-emitting device of the present invention.

The package of the present invention is the package for a semiconductor light-emitting device including at least a molded resin and is characterized in that the molded resin comprises (A) a SiH-containing polyorganosiloxane and (B) a filler and an amount of SiH existing in the molded resin after a heat treatment thereof at 200° C. for 10 minutes is 20 to 65 μmol/g. Namely, regardless of inclusion of a heating step in the production steps, it is characterized in that the amount of SiH existing in the molded resin is 20 to 65 μmol/g after the molded resin or the package is further heated at 200° C. for 10 minutes. By further heating the molded resin or the package at 200° C. for 10 minutes, the resin is further cured and stabilized and therefore this heating is preferable.

The package of the present invention is preferably the package for a semiconductor light-emitting device including at least the molded resin, wherein the molded resin comprises (A) a SiH-containing polyorganosiloxane and (B) a filler and an amount of SiH existing in the molded resin is 30 to 120 μmol/g. Namely, the amount of SiH existing in the molded resin measured without heating the package at 200° C. for 10 minutes is preferably 30 to 120 μmol/g.

"SiH" used herein refers to a partial structure in which Si (silicon) and H (hydrogen) are directly linked. SiH may be in a main chain or side chain of the polyorganosiloxane.

As described above, silicone resins have been recently used for packages for semiconductor light-emitting devices. The present inventors have found that in the semiconductor light-emitting devices including packages in which silicone resins are used, the packages forming the semiconductor light-emitting devices are expanded due to heat generated from semiconductor light-emitting elements, so that metal wirings or encapsulants tend to be detached from the molded resins. As a result of extensive studies, the present inventors have found that detachment of metal wirings or encapsulants from the molded resins resulting from expansion of the packages containing silicone resins due to heat can be prevented by providing a certain amount of SiH in the molded resins forming the packages.

In the present invention, when the amount of SiH existing in 1 g of the molded resin forming the package is too high, viscosity may be increased too much or detachment may occur due to changes in shape resulting from generation of hydrogen. On the other hand, when the amount of SiH existing in 1 g of the molded resin is too low, improvements in reflectivity due to the existence of SiH may not be sufficient and adhesiveness to metals may be decreased. It is preferable that the amount of SiH existing in the molded resin is generally 20 μmol/g or more, still preferably 25 μmol/g or more and yet preferably 30 µmol/g or more and generally 65 µmol/g or less, still preferably 60 µmol/g or less and yet preferably 55 µmol/g or less as measured after heating of the molded resin at 200° C. for 10 minutes, in terms of suppressing detachment.

It is also preferable that the amount of SiH existing in the molded resin is generally 30 µmol/g or more, still preferably 35 µmol/g or more and yet preferably 40 µmol/g or more and generally 120 µmol/g or less, still preferably 110 µmol/g or less and yet preferably 90 µmol/g or less as measured without heating of the molded resin at 200° C. for 10 minutes, in terms of suppressing detachment.

According to the present invention, the amount of SiH in the molded resin is measured as follows.

The molded resin to be measured is the one obtained by molding a resin composition described below and curing the composition by applying heat or light energy. According to the present invention, the molded resin which is obtained by curing the resin composition at 150° C. for 3 minutes is subjected to measurement. "Curing" as used herein refers to conversion from a fluid state to a non-fluid state. For example, an object of interest is cured when it does not have any fluidity after being left for 30 minutes inclined at 45 degrees from a horizontal.

However, when the filler described below is added at a high concentration, an object of interest may not be cured even when it does not have any fluidity after being left inclined at 45 degrees from a horizontal due to emergence of thixotropic nature. In this case, the object of interest is determined to be cured when it does not deform plastically and has a hardness value of 5 or more as measured on a durometer type A.

Then, the cured molded resin is measured for the amount of SiH existing therein. The measurement is carried out according to the following method. The amount of SiH existing may be measured on a molded resin which has been already molded, on a molded resin forming a package or a molded resin or a package containing a molded resin after heating at 200° C. for 10 minutes.

<Measurement Method of the Amount of SiH>

A method for measurement of SiH by IR measurement can be based on a ratio (ratio of intensity) of the peak area attributed to Si—H stretching bond vibration at 2167 cm$^{-1}$ to the peak area attributed to C—H bond symmetrical stretching vibration of the methyl group at 2904 cm$^{-1}$. More specifically, in this method for measurement, the amount of SiH existing in the resin mold is measured by evaluating the reduction by % in the amount of SiH after a curing reaction with the amount of SiH existing in a polyorganosiloxane (a silicone resin) before curing being 100%. Namely, it is required to preliminarily identify the structure of a silicone resin used for a molded resin or the like to be measured for the amount of SiH existing by NMR or the like technique and to determine the amount of SiH contained in the silicone resin before curing.

1) When a silicone resin used in a molded resin (a cured silicone resin (polyorganosiloxane) article) to be measured for the amount of SiH existing is not yet identified, the cured silicone resin article is subjected to structural analysis by solid state NMR or the like to identify the silicone.

2) The silicone resin (before curing) as identified in the above step 1) is prepared for IR measurement to determine the ratio of intensity at 2167 cm$^{-1}$/2904 cm$^{-1}$ before curing.

The IR measurement is carried out as follows:
Instrument used: Varian infrared spectrometer, FTS-7000;
Measurement condition: rapid scan method;
Transmission measurement by scanning on a normal infrared interferometer;
Detector: MCT Detector;
Scanning frequency: 20 kHz; and
Resolution: 4 cm$^{-1}$.

1) A cured silicone resin article to be measured for IR is sectioned with a razor to a thickness such that IR absorption is not saturated, and transmission measurement is carried out.

2) The ratio (intensity ratio) of the peak area attributed to Si—H stretching bond vibration at 2167 cm$^{-1}$ to the peak area attributed to C—H bond symmetrical stretching vibration of the methyl group at 2904 cm$^{-1}$ is calculated for each sample.

3) IR measurement is carried out for a cured silicone resin article to be measured for the amount of SiH existing according to the similar method as above to determine the ratio of intensity at 2167 cm$^{-1}$/2904 cm$^{-1}$.

4) The ratio of intensity at 2167 cm$^{-1}$/2904 cm$^{-1}$ of the cured silicone resin article to be measured for the amount of SiH existing determined in the above step 3) is divided by the ratio of intensity at 2167 cm$^{-1}$/2904 cm$^{-1}$ before curing determined in the above step 2) to calculate the remaining ratio of SiH in the cured silicone resin article. Based on the amount of SiH before curing which has been preliminarily determined and the remaining ratio of SiH in the cured silicone resin article, the amount of SiH existing in the cured silicone resin article of interest is calculated.

When a silicone resin (before curing) which is used for a molded resin to be measured for the amount of SiH existing is not available, the amount of SiH existing can be determined as follows. First of all, the methyl group content in the molded resin to be measured for the amount of SiH existing is measured by solid state NMR or the like technique. Next, several different silicone resins are prepared which have known and various molar ratios between methyl groups and SiH groups and measured for IR. A calibration curve is then obtained for the ratio of intensity at 2167 cm$^{-1}$/2904 cm$^{-1}$ relative to the number ratio of SiH to methyl groups. Based on the methyl group content in the molded resin to be measured for the amount of SiH existing determined initially and the calibration curve obtained, the amount of SiH existing in the molded resin can be determined.

The amount of SiH existing in the molded resin can be adjusted to the above range by appropriately selecting the source and amount of the polyorganosiloxane, specifically by increasing the amount of polyorganosiloxane having a hydrosilyl group or decreasing the amount of polyorganosiloxane having a vinyl group among the starting material polyorganosiloxane. The above range can also be achieved by adjusting temperature or time of polyorganosiloxane molding and post-cure.

It is preferable that the molded resin of the present invention can maintain high reflectivity for visible light. When the molded resin has a thickness of 0.5 mm, it preferably has the reflectivity of 60% or more, more preferably 80% or more and still more preferably 90% or more for light at a wavelength of 460 nm.

When the molded resin has a thickness of 0.5 mm, it preferably has the reflectivity of 60% or more, more preferably 80% or more and still more preferably 90% or more for light at a wavelength of 400 nm.

The reflectivity of the molded resin can be controlled through the type of binder resin or filler used for the molded resin or the particle diameter and content of the filler. The binder resin used in the molded resin refers to a resin component forming the molded resin and means herein the polyorganosiloxane.

2. Polyorganosiloxane

The molded resin of the present invention comprises the SiH-containing polyorganosiloxane. The polyorganosiloxane refers to a macromolecule material in which an organic group is added to a structure having a moiety in which a silicon atom is linked to another silicon atom via an oxygen atom. It generally refers to an organic polymer having a backbone with a siloxane bond and may include, for example, the compound represented by the following general compositional formula (1) or a mixture thereof:

$$(R^1R^2R^3SiO_{1/2})_M(R^4R^5SiO_{2/2})_D(R^6SiO_{3/2})_T(SiO_{4/2})_Q \quad (1)$$

in the above formula (1), $R^1$ to $R^6$ are independently selected from an organic functional group, a hydroxyl group and a hydrogen atom; M, D, T and Q is a number between 0 or more and less than 1 with satisfying M+D+T+Q=1.

The polyorganosiloxane may be liquid or solid at normal temperature and pressure. The normal temperature means a temperature in the range of 20° C.±15° C. (5 to 35° C.) and the normal pressure means pressure equal to atmospheric pressure and is around 1 atm.

Polyorganosiloxanes can generally be classified by curing mechanism into addition polymerization curing type polyorganosiloxanes, polycondensation curing type polyorganosiloxanes, ultraviolet curing type polyorganosiloxanes, and peroxide vulcanization type polyorganosiloxanes. Among these, the addition polymerization curing type (addition-type polyorganosiloxanes) and condensation curing type (condensation-type polyorganosiloxanes) are suitable. These are further described hereinbelow.

<2-1. Addition-Type Polyorganosiloxanes>

The addition-type polyorganosiloxane refers to the one in which polyorganosiloxane chains are cross-linked by an organic addition bond. The compounds can be exemplified by compounds that have the Si—C—C—Si bond at the cross-linking sites and are obtained by, for example, mixing (C1) an alkenyl group-bearing silicon-containing compound such as vinylsilane and (C2) a hydrosilyl group-bearing silicon-containing compound such as hydrosilane in an amount ratio so as to obtain the molar ratio of the total amount of hydrosilyl group to the total amount of alkenyl group of 0.5 times or more and 2.0 times or less and reacting them in the presence of (C3) an addition polymerization catalyst such as a Pt catalyst.

As described above, the present inventors have identified the problem in semiconductor light-emitting devices including packages that the package which forms the semiconductor light-emitting device is expanded due to heat generated from a semiconductor light-emitting element and metal wirings or encapsulants tend to be detached from the molded resin. Meanwhile, the present inventors have found that the expansion of the molded resin which forms the package is resulting from an alkenyl group, particularly a vinyl group in the molded resin when the package is formed by the molded resin containing the addition-type polyorganosiloxane. Thus, when the addition-type polyorganosiloxane is used, the amounts of the above compounds (C1) and (C2) are adjusted so that the amount of the (C1) is less than that of the (C2), thereby preventing expansion of the molded resin which forms the package due to the alkenyl group in the silicone resin.

The alkenyl group-bearing silicon-containing compound (C1) may include polyorganosiloxanes represented by the following general formula (2):

$$R_nSiO_{[(4-n)/2]} \quad (2)$$

and having at least two alkenyl groups linked to one silicon atom in the molecule.

In the above formula (2), R is the same or different substituted or non-substituted monovalent hydrocarbon group, an alkoxy group or a hydroxyl group, and n is a positive number satisfying 1≤n<2.

In the alkenyl group-bearing silicon-containing compound (C1), the alkenyl group is preferably an alkenyl group having 2 to 8 carbon atoms such as a vinyl, allyl, butenyl, pentenyl group. When R is the hydrocarbon group, it is selected from monovalent hydrocarbons having 1 to 20 carbon atoms such as alkyl groups including methyl and ethyl groups, vinyl groups, phenyl groups and the like. It is preferably a methyl, ethyl or phenyl with the methyl group being further preferred because of less deterioration in reflectivity caused by heat or UV. In addition, when it is the alkyl group, having two alkyl groups for one Si atom is preferred because the reflectivity can be decreased.

When anti-UV property is desired, about 65% of the R in the above formula is preferably a methyl group. Namely, the number of functional groups contained other than methyl groups relative to the number of Si (number of mol) is preferably about 0.5 (mol). More preferably, 80% or more is a methyl group. R may be an alkoxy group having 1 to 8 carbon atoms or a hydroxyl group, and the proportion of the alkoxy or hydroxyl group contained is preferably 3% or less of the weight of the alkenyl group-bearing silicon-containing compound (C1). n is a positive number satisfying 1≤n<2. When this value is 2 or more, sufficient adhesion between a package material and a conductive material such as a lead frame may not be obtained, while when this is less than 1, synthesis of such polyorganosiloxane may be difficult.

The alkenyl group-bearing silicon-containing compound (C1) can be, for example, a vinylsilane or a vinyl group-containing polyorganosiloxane, and a single one of these can be used by itself or two or more may be used in any ratio and combination. A vinyl group-containing polyorganosiloxane having at least two vinyl groups in the molecule is preferred among the preceding.

The followings are specific examples of vinyl group-containing polyorganosiloxanes that have at least two vinyl groups in the molecule.

Both-end vinyl-terminated polydimethylsiloxanes
DMS-V00, DMS-V03, DMS-V05, DMS-V21, DMS-V22, DMS-V25, DMS-V31, DMS-V33, DMS-V35, DMS-V41, DMS-V42, DMS-V46, and DMS-V52 (all from Gelest, Inc.)

Both-end vinyl-terminated dimethylsiloxane-diphenylsiloxane copolymers
PDV-0325, PDV-0331, PDV-0341, PDV-0346, PDV-0525, PDV-0541, PDV-1625, PDV-1631, PDV-1635, PDV-1641, PDV-2331, and PDV-2335 (all from Gelest, Inc.)

Both-end vinyl-terminated phenylmethylsiloxanes
PMV-9925 (from Gelest, Inc.)

trimethylsilyl-end-capped vinylmethylsiloxane-dimethylsiloxane copolymers
VDT-123, VDT-127, VDT-131, VDT-153, VDT-431, VDT-731, and VDT-954 (all from Gelest, Inc.)

vinyl T-structure polymers
VTT-106 and MTV-124 (both from Gelest, Inc.)

The SiH-containing polyorganosiloxane according to the present invention is preferably obtained by mixing the above (C2) compound and the (C1) compound, specifically a SiH-containing organosilicic compound and a $Si(CHCH_2)$-containing organosilicic compound, so as to obtain the equivalent ratio (molar ratio) between SiH and $Si(CHCH_2)$ of 0.9 to 2.5 because the amount of SiH existing in the molded resin can be controlled to a specific range. It is more preferably 1.2 to 2.0.

<2-2. Condensation-Type Polyorganosiloxanes>

The condensation-type polyorganosiloxanes can be exemplified by compounds that have the Si—O—Si bond at the crosslinking sites and are obtained by the hydrolysis/polycondensation of alkylalkoxysilane. Specific examples are the polycondensates obtained by the hydrolysis/polycondensation of compounds represented by the following general formulas (3) and/or (4), and/or their oligomers.

$$M^{m+}X_n Y^1_{m-n} \qquad (3)$$

In the formula (3), M represents at least one element selected from the group consisting of silicon, aluminum, zirconium and titanium; X represents a hydrolysable group; $Y^1$ represents a monovalent organic group; m represents an integer of 1 or more representing the valence of M; and n represents an integer of 1 or more representing the number of X group, provided that m≥n.

$$(M^{s+}X_t Y^1_{s-t-1})_u Y^2 \qquad (4)$$

In the formula (4), M represents at least one element selected from the group consisting of silicon, aluminum, zirconium and titanium; X represents a hydrolysable group; $Y^1$ represents a monovalent organic group; Y2 represents an u-valent organic group; represents an integer of 1 or more representing the valence of M; t represents an integer of 1 or more and s−1 or less; and u represents an integer of 2 or more.

Known condensation-type polyorganosiloxanes can be used; for example, the members for semiconductor light-emitting devices described in Japanese Patent Application Laid-open Nos. 2006-77234, 2006-291018, 2006-316264, 2006-336010, and 2006-348284 and WO 2006/090804 are suitable.

When the condensation-type polyorganosiloxane is used in the present invention, the content of SiH can be adjusted to the range according to the present invention by appropriately selecting the source and amount of incorporation of or temperature or time of molding of the condensation-type polyorganosiloxane or temperature or time of post-cure.

Among the polyorganosiloxanes having the characteristics described in the above <2-1. Addition-type polyorganosiloxanes> and <2-2. Condensation-type polyorganosiloxanes>, an addition-type polyorganosiloxane from which no component is eliminated during reaction is preferred. This is because, under the assumption that curing is carried out in a closed metal mold, by-products are not generated (which are unfavorable because they may increase pressure in a molding container or may leave foams in a cured material) and also satisfactory molding processability is achieved due to irreversibility of the reaction, as well as it is advantageous in terms of heat resistance of the cured article (less variation in weight) and the like.

Depending on the method of mold processing in which a component(s) generated during the condensation reaction does not significantly affect the molding processability, the condensation-type polyorganosiloxane may also be used. In this case, a condensation-type polyorganosiloxane particularly having the silanol content of 0.01% by weight or more and 10% by weight or less is preferable.

The addition-type polyorganosiloxane and the condensation-type polyorganosiloxane may be used in combination.

3. Filler

The filler according to the present invention is added in order to increase the hardness of the molded resin. Well known inorganic or organic fillers can be appropriately selected which do not inhibit curing of the resin.

The inorganic filler which can be used for the present invention may include metal oxides such as aluminum oxide (alumina), silicon oxide, titanium oxide (titania), zinc oxide, magnesium oxide and the like; metal salts such as calcium carbonate, barium carbonate, magnesium carbonate, barium sulfate, aluminum hydroxide, calcium hydroxide, magnesium hydroxide and the like; boron nitride, alumina white, silica, aluminum silicate, zirconium silicate, aluminum borate, clay, talc, kaolin, mica, synthetic mica and the like.

The organic filler may include resin particles such as fluororesin particles, guanamine resin particles, melamine resin particles, acrylic resin particles, silicone resin particles and the like. However, these do not limit the filler.

Among these, in terms of exhibiting high performance as a reflecting material, white pigments exhibiting white color are preferred and among others, inorganic white pigments are more preferred. Among inorganic white pigments, the ones having low absorption of visible light and high refractive index, specifically one or two or more selected from the group consisting of alumina, titania and boron nitride are preferred with alumina and/or titania being more preferred. Particularly, alumina is preferred because the reflectivity for light having a short wavelength can also be increased.

One filler or two or more fillers in a mixture may be used.

The alumina as used herein refers to an oxide of aluminum with any crystalline form. α-alumina is suitably used which has such properties that it is chemically stable, it has a high melting point, it has high mechanical strength, it has high hardness, it has high insulation resistance and the like.

Alumina that contains an element other than aluminum and oxygen as an impurity is not preferred because it is colored due to the absorption of light in a visible light range. Preferred alumina which contains chromium, iron and titanium respectively at 0.02% or less, more preferably 0.01% or less can be used. Thermal conductivity of the material is preferably high and in order to increase thermal conductivity, alumina used preferably has 98% or more and more preferably 99% or more purity with low sodium alumina being particularly preferred.

Alumina and/or titania having the following shape are particularly preferred as the filler (white pigment).

The white pigment preferably has an aspect ratio of primary particles of 1.0 to 4.0 and further preferably 1.2 to 2.0. The molded resin in which the white pigment having the aspect ratio within the above range is used tends to have high reflectivity due to scattering and has high reflection of light having a short wavelength particularly in the near-ultraviolet range. Accordingly, the semiconductor light-emitting device containing such a molded resin has high output. When the aspect ratio exceeds 4.0, the shape of the white pigment may be too long, thereby reducing the reflectivity.

The aspect ratio is determined by dividing the length of a long axis by the length of a short axis of a particle measured in electron microscopy using SEM and the like, and it can be calculated from the average of multiple points (e.g. 10 points) measured with SEM.

The white pigment having the aspect ratio within the above range is preferably contained 70% by volume or more, more preferably 80% by volume or more and particularly preferably 90% by volume or more relative to the total amount of the filler in the molded resin according to the invention.

The white pigment preferably has a primary particle diameter of 0.1 μm or more and 2 μm or less. The lower limit is preferably 0.15 μm or more and still more preferably 0.2 μm or more and the upper limit is preferably 1 μm or less, still more preferably 0.8 μm or less and particularly preferably 0.5 μm or less.

When the primary particle diameter is too small, the white pigment tends to have lower reflectivity due to low scattered light intensity. When the primary particle diameter is too large, the white pigment may have increased scattered light intensity, while the reflectivity tends to be decreased due to the tendency for forward scattered light. For the purpose of increasing the filling fraction of the white pigment in the resin composition, a white pigment having the primary particle diameter of more than 2 µm can be used in combination.

The white pigment preferably has an average particle diameter of secondary particles (D50) of 0.2 µm or more and 10 µm or less and more preferably 0.2 µm or more and 5 µm or less. For the purpose of increasing the filling fraction of the white pigment in the resin composition, a white pigment having the average particle diameter of secondary particles of more than 10 µm can be used in combination.

"Primary particle" as used herein refers to the smallest unit of the particles forming powder that allows clear discrimination from other particles. The primary particle diameter refers to a particle diameter of primary particles measured by electron microscopy using SEM and the like. Secondary particle refers to an aggregated particle of primary particles, and the average particle diameter of secondary particles refers to the particle diameter measured with a grain size analyzer and the like after dispersing powder in an appropriate dispersing medium (e.g. water when alumina is used). When particle diameters of primary particles are highly variable, several points (e.g. 10 points) may be observed using SEM and the average thereof may be determined as the particle diameter. When individual particles are not spherical upon measurement, the length of the longest axis, i.e., of the long axis is determined as the particle diameter.

The filler is preferably subjected to surface treatment in order to improve adhesiveness with the binder resin in the molded resin. Surface treatment may be carried out with a coupling agent such as a silane coupling agent or a titanium coupling agent.

Such a coupling agent is preferably epoxy-functional alkoxysilanes such as γ-glycidoxypropyltrimethoxysilane, γ-glycidoxypropylmethyl diethoxysilane, β-(3,4-epoxycyclohexyl)ethyltrimethoxysilane; amino-functional alkoxysilanes such as N-β(aminoethyl)-γ-aminopropyltrimethoxysilane, γ-aminopropyltriethoxysilane, N-phenyl-γ-aminopropyltrimethoxysilane; mercapto-functional alkoxysilanes such as γ-mercaptopropyltrimethoxysilane and the like.

The method of surface treatment in use of the coupling agent may be carried out according to a conventional treatment method without specific limitation. For example, a method may be used in which a silane coupling agent is dissolved in an appropriate solvent, the filler is soaked in this solution and the solvent is removed and the filler is dried by heating. When the coupling agent is used for surface treatment, 0.5 to 10 weight parts of the coupling agent per 100 weight parts of the filler is preferably used.

The amount of the filler contained in the molded resin may be appropriately selected according to the type of the filler used. However, the ratio of the binder resin and the filler in the molded resin is preferably 10 to 60:90 to 40 because this allows better control of Shore D hardness of the molded resin within a suitable range, facilitating production of the molded resin having high resistance to temperature, less detachment of a lead frame or an encapsulant from the resin material and high resistance to physical impact without cracks or chips. The above range is more preferably 20 to 40:80 to 60.

4. Curing Catalyst

A curing catalyst according to the present invention is a catalyst for curing the binder resin. Addition of the curing catalyst facilitates polymerization reactions for curing. When the amount of incorporation of the curing catalyst is high, the amount of SiH existing in the molded resin tends to be decreased, while the amount of incorporation of the curing catalyst is low, the amount of SiH existing in the molded resin tends to be increased. Therefore, it is preferable to adjust the amount of incorporation of the curing catalyst so as to obtain the specific range of the amount of SiH existing and to adjust the curing speed.

In the present invention, addition polymerization catalysts and polycondensation catalysts may be used depending on curing mechanisms of the polyorganosiloxane. The addition polymerization catalyst is the catalyst which facilitates a hydrosilylation addition reaction between the alkenyl group in the above (C1) component and the hydrosilyl group in the above (C2) component. The addition polymerization catalyst may be exemplified by platinum group metal catalysts such as platinum-based catalysts, e.g. platinum black, platinic chloride, chloroplatinic acid, reaction products of chloroplatinic acid and monohydric alcohols, complexes between chloroplatinic acid and olefins, platinum bisacetoacetate; palladium-based catalysts, rhodium-based catalysts and the like. The amount of incorporation of the addition polymerization catalyst is generally 1 ppm or more, preferably 2 ppm or more and generally 500 ppm or less, preferably 100 ppm or less generally as a platinum group metal relative to the total weight of the (C1) and (C2) components. Operating in accordance with the preceding can provide a high catalytic activity.

An acid such as hydrochloric acid, nitric acid, sulfuric acid, or an organic acid, or an alkali such as ammonia or an amine, or a metal chelate compound can be used as the polycondensation catalyst, and a metal chelate compound containing at least one selection from Ti, Ta, Zr, Al, Hf, Zn, Sn, and Pt can be favorably used as the polycondensation catalyst. Among the preceding, the metal chelate compound preferably contains at least one selection from Ti, Al, Zn, and Zr, wherein the use of a metal chelate compound that contains Zr is more preferred. These catalysts are selected in consideration of stability, hardness of films, anti-yellowing property, curability and the like in the semiconductor light-emitting device package material.

Preferably, the amount of incorporation of the polycondensation catalyst is generally 0.01 to 10% by weight and more preferably 0.05 to 6% by weight relative to the total weight of the components represented by the above formulas (3) and (4).

When the amount of addition is within the above range, curability and storage stability of the semiconductor light-emitting device package material and quality of the package are preferable. When the amount of addition reaches or exceeds the above upper limit, the storage stability of the package material is deteriorated and when it is below the above lower limit, productivity of the package may be decreased due to increased curing time and quality of the package may be damaged due to uncured components.

5. Other Components

The resin composition of the present invention may contain one or two or more other components in any ratio and combination as needed so long as the purpose of the present invention is not affected.

For example, with the objective of controlling fluidity of the resin composition or of suppressing sedimentation of the white pigment, finely divided silica particles may be included besides the filler. The content of the finely divided silica particles is generally 60 weight parts or less and preferably 40 weight parts or less per 100 weight parts of the polyorganosiloxane.

The finely divided silica particles used for the present invention is not specifically limited; however, it may generally have the specific surface area according to BET method of 50 m$^2$/g or more, preferably 80 m$^2$/g or more and still more preferably 100 m$^2$/g or more. It is generally 300 m$^2$/g or less and preferably 200 m$^2$/g or less. When the specific surface area is too small, no effect is seen from the addition of the finely divided silica particles; when the specific surface area is too large, it becomes very difficult to effect dispersion in the resin. Finely divided silica particles may be used that have been subjected to a surface hydrophobicization by, for example, reacting a surface modifier with the silanol groups that are present on the surface of the hydrophilic finely divided silica particles.

The surface modifier can be exemplified by alkylsilane compounds and specifically by dimethyldichlorosilane, hexamethyldisilazane, octylsilane, and dimethylsilicone oil.

The finely divided silica particles can be exemplified by fumed silica. Fumed silica is produced by the oxidation and hydrolysis of SiCl$_4$ gas in an 1100 to 1400° C. flame provided by the combustion of a mixed gas of H$_2$ and O$_2$. The primary particles in fumed silica are spherical ultrafine particles that have an average particle diameter of about 5 to 50 nm and that have amorphous silicon dioxide (SiO2) as their main component; these primary particles aggregate with each other to form secondary particles having a particle diameter of several hundred nanometers. Fumed silica, because it is an ultrafine particulate and is produced by quenching, has a surface structure that is in a chemically active state.

"Aerosil" (registered trademark) from Nippon Aerosil Co., Ltd., is a specific example, and examples of hydrophilic Aerosil (registered trademark) are "90", "130", "150", "200", and "300", while examples of hydrophobic Aerosil (registered trademark) are "RX50", "NAX50", "NY90G", "RY50", "NY50", "R8200", "R972", "R972V", "R972CF", "R974", "R202", "R805", "R812", "R812S", "RY200", "RY200S", and "RX200".

An inorganic fiber, e.g., glass fiber, may be incorporated with the objective of raising the strength and toughness of the post-thermosetting resin composition. For example, boron nitride, aluminum nitride, or fibrous alumina, which has high thermal conductivities, may be incorporated separately from the white pigment already described above in order to raise the thermal conductivity. In addition, quartz beads, glass beads, and so forth, may be incorporated with the objective of lowering the linear expansion coefficient of the cured material.

When these are added, the intended effect is not obtained when their amount of incorporation is too low, while an amount of incorporation that is too large raises the viscosity of the resin composition and thus affects the processability. For these reasons, their amount of incorporation should be selected as appropriate from within a range where a satisfactory effect is developed and the processability of the material is not impaired. This is generally not more than 100 weight parts and preferably not more than 60 weight parts per 100 weight parts of the polyorganosiloxane.

The resin composition may further contain an ionic migration (electrochemical migration) preventing agent, a curing accelerator, a curing retarder, an anti-aging agent, a radical inhibitor, an ultraviolet absorbing agent, an adhesion promoting agent, a flame retarder, a surfactant, a storage stability improving agent, an anti-ozonant, a photostabilizer, a thickening agent, a plasticizer, a coupling agent, an antioxidant, a thermostabilizer, an electrical conductivity imparting agent, an antistatic agent, a radiation shielding agent, a nucleating agent, a phosphorous-based peroxide decomposer, a lubricant, a pigment, a metal deactivator, a physical property adjusting agent and the like at a range which does not deteriorate the purpose and effect of the present invention.

Among the proceedings, it is preferred to add the curing retarder. When the amount of incorporation of the curing retarder is high, the amount of SiH existing in the molded resin may be increased and when the amount of incorporation of the curing retarder is low, the amount of SiH existing in the molded resin may be decreased. Therefore, it is preferably to adjust the amount of incorporation of the curing retarder so as to obtain the specific range of the amount of SiH existing and to control the curing speed.

The curing retarder is an important component particularly in liquid injection molding of the addition polymerization-type polyorganosiloxane composition which has high curing speed.

The curing retarder for addition polymerization reactions may include compounds containing an aliphatic unsaturated bond, organophosphorus compound, organosulfur compounds, nitrogenous compounds, tin compounds, organic peroxides and the like and these may be used in combination.

The compounds containing an aliphatic unsaturated bond may be exemplified by propargyl alcohols such as 3-hydroxy-3-methyl-1-butyne, 3-hydroxy-3-phenyl-1-butyne, 3-(trimethylsilyloxy)-3-methyl-1-butyne, 1-ethynyl-1-cyclohexanol; enyne compounds; maleic esters such as dimethyl maleate and the like. Compounds that contain a triple bond are preferred among these compounds containing an aliphatic unsaturated bond. The organophosphorus compounds can be exemplified by triorganophosphines, diorganophosphines, organophosphines, and triorganophosphites. The organosulfur compounds can be exemplified by organomercaptans, diorgano sulfides, hydrogen sulfide, benzothiazole, thiazole, and benzothiazole disulfide. The nitrogenous compounds can be exemplified by ammonia, primary to tertiary alkylamines, arylamines, urea, and hydrazine. The tin compounds can be exemplified by stannous halide dihydrates and stannous carboxylates. The organoperoxides can be exemplified by di-t-butyl peroxide, dicumyl peroxide, benzoyl peroxide, and t-butyl perbenzoate.

Among the retarders given above, benzothiazole, thiazole, dimethyl maleate, 3-hydroxy-3-methyl-1-butyne, 3-(trimethylsiloxy)-3-methyl-1-butyne, and 1-ethynyl-1-cyclohexanol are preferred for their excellent retardation activity and ease of reagent acquisition.

The amount of the curing retarder to be added to addition polymerization reactions is not specifically limited. However, the lower limit of the preferred amount of addition per mole of the curing catalyst used is $10^{-1}$ mole or more and more preferably 1 mole or more and the upper limit thereof is $10^3$ moles or less and more preferably 50 moles or less.

A single one of these retarders may be used or two or more may be used in combination.

The curing retarder for polycondensation reactions may include lower alcohols containing 1 to 5 carbon atoms, amines having molecular weight of 500 or lower, nitrogenous or sulfurous organic compounds, compounds which react with or form a hydrogen bond with silanol such as epoxy group-containing compounds and the like.

The amount of the curing retarder to be added to polycondensation reactions can be selected variously. However, the lower limit of the preferred amount of addition per mole of the reactive terminal group in the condensation-type polyorganosiloxane used is $10^{-1}$ mole or more and more preferably 1 mole or more and the upper limit thereof is 10 moles or lower and more preferably 5 moles or lower. These compounds can interact with silanol and act as the protective group, thereby suppressing the curing speed.

The coupling agent which can be included in the resin composition may include a silane coupling agent. The silane coupling agent should contain in each molecule at least one hydrolysable silicon group and at least one functional group reactive with organic groups, but is not otherwise particularly limited. Considered from the standpoint of the handling characteristics, the group reactive with organic groups is preferably at least one functional group selected from the epoxy group, methacryl group, acryl group, isocyanate group, isocyanurate group, vinyl group, and carbamate group, while considered from the standpoint of the curability and adhesiveness the epoxy group, methacryl group, and acryl group are particularly preferred. Considered from the standpoint of the handling characteristics, the hydrolysable silicon group is preferably an alkoxysilyl group, while the methoxysilyl group and ethoxysilyl group are particularly preferred in terms of reactivity. Considered from the standpoint of the handling characteristics, the hydrolysable silicon group is preferably an alkoxysilyl group, while the methoxysilyl group and ethoxysilyl group are particularly preferred in terms of reactivity.

Examples of preferred silane coupling agents are alkoxysilanes having the epoxy functional group, e.g., 3-glycidoxypropyltrimethoxysilane, 3-glycidoxypropyltriethoxysilane, 2-(3,4-epoxycyclohexyl)ethyltrimethoxysilane, and 2-(3,4-epoxycyclohexyl)ethyltriethoxysilane, and alkoxysilanes bearing the methacryl group or acryl group, e.g., 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane, and acryloxymethyltriethoxysilane.

The resin composition can contain, in order to improve adhesiveness, a compound that has the Si—O—Si bond at the crosslinking sites and are obtained by hydrolysis/polycondensation of alkylalkoxysilane. The amount of this compound is preferably 5 weight parts or less per 100 weight parts of the resin composition.

6. Reflectivity

The package of the present invention preferably can maintain a high reflectivity for visible light. Specifically, the reflectivity for light at a wavelength of 460 nm is preferably at least 60%, more preferably at least 80%, and even more preferably at least 90%.

In addition, the reflectivity for light at a wavelength of 400 nm is preferably at least 60%, more preferably at least 80%, and even more preferably at least 90%.

The reflectivity of the package can be controlled through, for example, the type of resin, the type of filler, and the particle diameter and content of the filler.

7. Refractive Index

The molded resin included in the package of the present invention preferably has refractive index of 1.41 to 1.54 for only the binder resin without filler. When refractive index of the binder resin in the molded resin is in this range, loss of light reflected at the interface between the molded resin and the encapsulant can be reduced in association with the resin used for the encapsulant. Refractive index of the molded resin included in the package of the present invention refers to refractive index at the time of molding of the binder resin in the molded resin.

Refractive index of the molded resin can be controlled through the type of the resin or the functional group in the resin. Specifically, refractive index may be increased by incorporating a phenyl group as the functional group and may be decreased by incorporating fluorine. It has been known that addition of about 0.8 (mol) phenyl groups per one Si (number of mol) to a dimethyl-type polyorganosiloxane (refractive index: 1.40 to 1.41) without a phenyl group may increase its refractive index to about 1.53 to 1.54.

Refractive index of the resin composition prior to curing or the molded resin (binder resin) can be measured with an Abbe refractometer.

8. Production Method of Present Molded Resin

The molded resin included in the package for a semiconductor light-emitting device according to the present invention may be obtained by molding the resin composition as described below.

<8-1. Production Method of Resin Composition>
(Materials)

In addition to the polyorganosiloxane (A) and the filler (B) as described above, finely divided silica particles, the curing catalyst, the curing retarder and other additives can be appropriately used as starting materials.

The amount of incorporation of each starting material is not specifically limited so long as it is within the range that the effect of the present invention can be obtained. However, the amount of incorporation of the polyorganosiloxane (A) is 15 to 70 weight parts and preferably 20 to 50 weight parts per 100 weight parts of the resin composition, the amount of incorporation of the filler (B) is 20 to 80 weight parts and preferably 30 to 70 weight parts per 100 weight parts of the resin composition and the amount of incorporation of the finely divided silica particles is 1 to 50 weight parts and preferably 3 to 30 weight parts per 100 weight parts of the resin composition. The amount of incorporation of the curing catalyst is, when it is a platinum-based catalyst for example, 1 to 20 ppm and preferably 2 to 10 ppm as the platinum concentration relative to the polyorganosiloxane. The amount of incorporation of the curing retarder is 0.1 to 1000 mol and preferably 1 to 50 mol per 1 mol of the curing catalyst used. A single one of these retarders may be used or two or more may be used in combination.

(Mixing Method)

Upon mixing of the starting materials, the polyorganosiloxane can be used as a liquid medium. For example, polyorganosiloxane, the filler, the curing catalyst and the like can be weighed at predetermined amounts and mixed according to the conventionally known method including mixing in a mixer, high speed disper, homogenizer, three-roll mixer, kneader, centrifugal foam separator and the like.

In the present invention, inorganic particles may be mixed by any method without limitation. However, they are preferably mixed while separating foam in a planetary stirring mixer, rotation/revolution vacuum mixer, thin film rotating mixer and the like. The planetary stirring mixer may include T. K. HIVIS MIX from Primix Corp., Planetary Mixer and Planetary Dispa from Asada Tekko., Planetary Mixer, Tri-Mix and PD Mixer from Inoue MFG., Inc., two-axis planetary mixer PLM and three-axis planetary mixer 3PLM from Ashizawa Finetech Ltd. and the like. For centrifugal stirring, the rotation/revolution vacuum mixer (specifically including ARV 310 from Thinky, V-mini 300V from EME Corporation, Mazerustar from Kurabo Industries Ltd. and the like) can be used. The thin film rotating mixer may include T. K. FILMIX from Primix Corp. and a mortar-type kneader may include Miracle KCK from Asada Tekko.

When small particles such as Aerosil which are liable to aggregate are mixed, small particles mixed may be subjected to cracking of aggregated particles in a bead mill or three-roll mixer, if necessary, and then mixed with a large particle component such as the filler which may be mixed easily.

In the step of mixing the starting materials, high water content of the resulting resin composition may decrease the amount of SiH existing in the molded resin and low water content may increase the amount of SiH existing in the molded resin. Therefore, the water content is preferably adjusted so as to obtain the specific range of the amount of SiH existing. In order to reduce incorporation of water in the resin composition, mixing may be carried out in reduced pressure environment. Reduced environmental pressure may generally be 0 kPa or more, preferably 0.1 kPa or more and still more preferably 0.5 kPa or more and generally 40 kPa or less, preferably 30 kPa or less and still more preferably 20 kPa or less. When pressure is lower than this range, maintenance of the reduced pressure may be difficult and require a highly precise apparatus and therefore economic effectiveness may be deteriorated. When pressure is above this range, removal of water tends to be insufficient.

Reduced pressure is preferably achieved in the environment of air or inert gas such as nitrogen or noble gas.

Relative humidity in the environment where reduced pressure is achieved may not be identified and may be varied according to temperature, pressure or the type of the device or procedure used in the step of reducing pressure. However, relative humidity before the operation of reducing pressure at 25° C. is generally 0% or higher and preferably 5% or higher and generally 80% or lower, preferably 70% or lower and still more preferably 60% or lower. When relative humidity is below this range, although water may be removed with improved efficiency, a special desiccant device may be required, resulting in reduced economic effectiveness and productivity. When relative humidity is above this range, removal of water tends to be insufficient.

When temperature of the materials upon mixing is too low compared to the temperature of the environment, water content of the resin composition may be increased due to local dew condensation.

By drying the filler, finely divided silica particles and the like with hot air before mixing, water content of the resin composition can be reduced. The temperature of this hot air drying is preferably 150° C. or higher and still more preferably 250° C. or higher.

(Mode of Mixing)

All of the above starting materials may be mixed to produce a one-component resin composition, or the resin composition may be two-component. The two-component resin composition may be prepared as (i) a polyorganosiloxane resin composition including the polyorganosiloxane, the filler and the finely divided silica particles as main components and (ii) a cross-linking agent solution including the curing catalyst and the curing retarder as main components, and the polyorganosiloxane resin composition (i) and the cross-linking agent solution (ii) may be mixed immediately prior to use.

(Storage of Resin Composition)

The storage method of the resin composition is not particularly limited. However, environmental temperature upon storage of 15° C. or lower is preferable because it can suppress rapid progress of the curing reaction and prevent defects upon filling of a metal mold during molding. Particularly, when environmental temperature upon storage of the resin composition is higher than 0° C., the amount of SiH existing tends to be decreased during storage and when environmental temperature is 0° C. or lower, preferably-20° C. or lower, the amount of SiH existing in the molded resin tends to be increased. Therefore, it is preferable to adjust environmental temperature upon storage so as to obtain the specific range of the amount of SiH existing.

<8-2. Molding Method>

The molding method for the molded resin of the present invention may include compression molding, transfer molding and injection molding methods. Compression molding, transfer molding and injection molding can be carried out in a compression molding machine, a transfer molding machine and an injection molding machine, respectively. Among these, injection molding is preferable because it uses relatively small metal mold, thereby being advantageous in terms of the costs for the metal mold and maintenance thereof.

Molding temperature (in case of injection molding, set temperature of a cylinder) may be appropriately selected according to the materials and is generally 80° C. or higher and 300° C. or lower, preferably 100° C. or higher and 250° C. or lower and still more preferably 130° C. or higher and 200° C. or lower. Molding time may be appropriately selected according to the curing speed of the materials and is generally 3 seconds or more and 1200 seconds or less, preferably 5 seconds or more and 900 seconds or less and still more preferably 10 seconds or more and 600 seconds or less.

Among the above ranges, molding temperature of 100° C. or higher and 250° C. or lower and molding time of 10 seconds or more and 60 seconds or less are preferable, and molding temperature of 100° C. or higher and 200° C. or lower and molding time of 5 seconds or more and 30 seconds or less are still more preferable. When molding temperature is too high and molding time is too long, the reaction between the SiH groups and the Si-vinyl groups excessively proceeds to leave less SiH than the predetermined amount of SiH in the molded resin.

In any molding methods, post-cure can be carried out if necessary. Temperature for post-cure is 100° C. or higher and preferably 150° C. or higher and 250° C. or lower and preferably 220° C. or lower. Post-cure time is generally 3 minutes or more and 24 hours or less, preferably 5 minutes or more and 10 hours or less and still more preferably 10 minutes or more and 5 hours or less.

By appropriately selecting curing conditions, the amount of SiH existing in the molded resin can be adjusted. Carrying out curing under the conditions that allow small total amount of heat required for curing of the molded resin is preferable because the amount of SiH in the molded resin can be adjusted appropriately. As described above, "curing" may include curing during molding and post-cure. It is preferable to carry out post-cure under relatively mild conditions. The mild curing conditions may include heating at 100° C. to 200° C. and preferably 150° C. to 200° C. for 5 minutes to 30 minutes.

The molded resin of the present invention may be molded with a metal wiring to give the package for a semiconductor light-emitting device. For example, this can be produced by a method in which a substrate having a wiring is prepared as the metal wiring and the molded resin is molded by injection molding using a metal mold on the substrate or by a method in which a lead frame as the metal wiring is provided in a metal mold and the molded resin is molded by injection molding.

9. Semiconductor Light-Emitting Device

The package for a semiconductor light-emitting device according to the present invention is used for a semiconductor light-emitting device generally including a semiconductor light-emitting element. The semiconductor light-emitting device is outlined with referring to the figures. However, the present invention is not limited to the following embodiments and may be practiced with any modifications without departing from the scope of the present invention.

FIGS. 1 to 8 show exemplified modes of the semiconductor light-emitting device according to the present invention which is formed by a package including a semiconductor light-emitting element 1, a molded resin 2 and a lead frame 5, a bonding wire 3, an encapsulant layer (transparent encapsulating layer) 8, an encapsulant layer containing a phosphor (phosphor layer) 4 and the like. The lead frame is one mode of the metal wiring included in the package, as described below.

Figure 2:
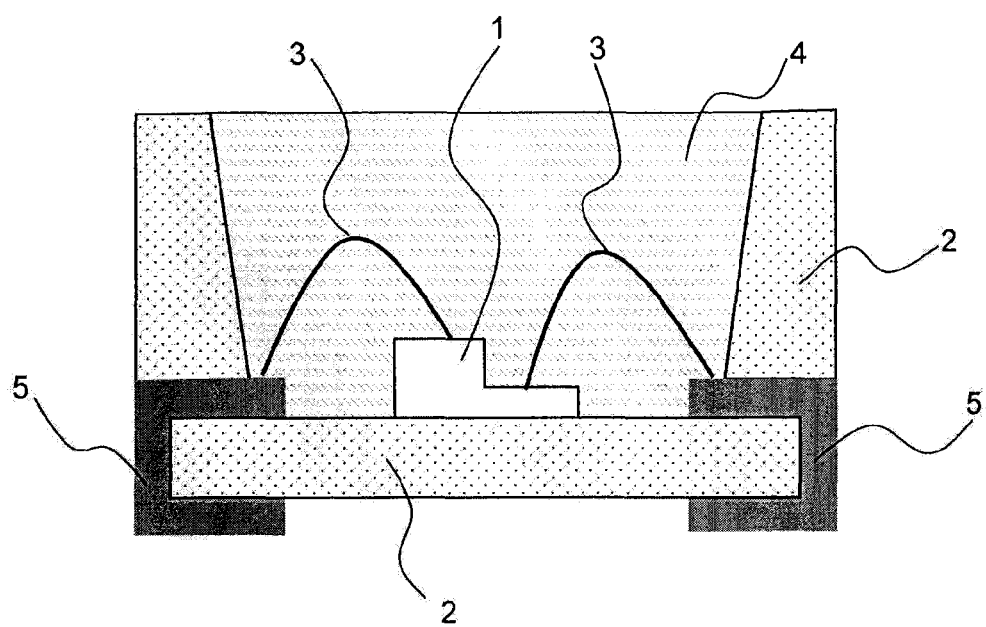
FIG. 2 is a conceptual diagram showing one mode of a semiconductor light-emitting device of the present invention.
Figure 3:
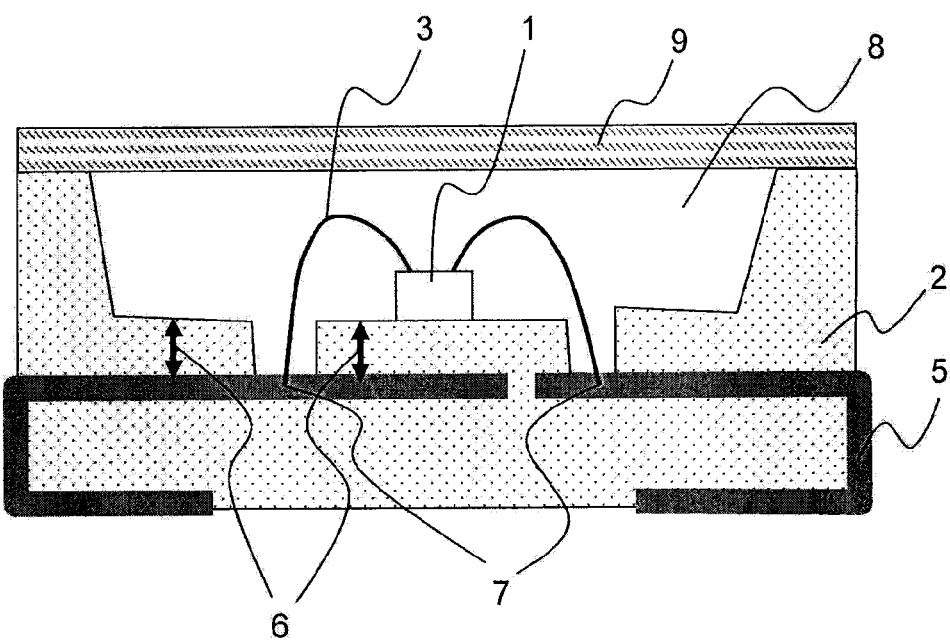
FIG. 3 is a conceptual diagram showing one mode of a semiconductor light-emitting device of the present invention.

The modes shown in FIGS. 1 to 8 show, for the sake of simplicity, the mode in which the semiconductor light-emitting element is encapsulated in the encapsulant layer containing a phosphor (phosphor layer) 4 (FIGS. 1, 2, 4, 5, 7 and 8) and the mode in which the semiconductor light-emitting element is encapsulated in the encapsulant and the phosphor layer is provided remotely from the semiconductor light-emitting element (FIG. 3: a remote phosphor mode as described below). However, as described below, for example, the modes of FIG. 2 in which instead of the phosphor layer, the encapsulant layer without a phosphor is used to encapsulate the semiconductor light-emitting element and in which instead of the phosphor layer, an encapsulant is used to encapsulate the semiconductor light-emitting element and then the phosphor layer 4 is provided at a position separated from the semiconductor light-emitting element are also included in the modes of the present invention. The modes in FIG. 3 in which the phosphor layer 9 is not provided and in which an encapsulant to which a phosphor is added is used as the encapsulant layer containing the phosphor in order to encapsulate the semiconductor light-emitting element are also included in the present invention.

Each component included in the semiconductor light-emitting device according to the present invention is now described.

Figure 6:
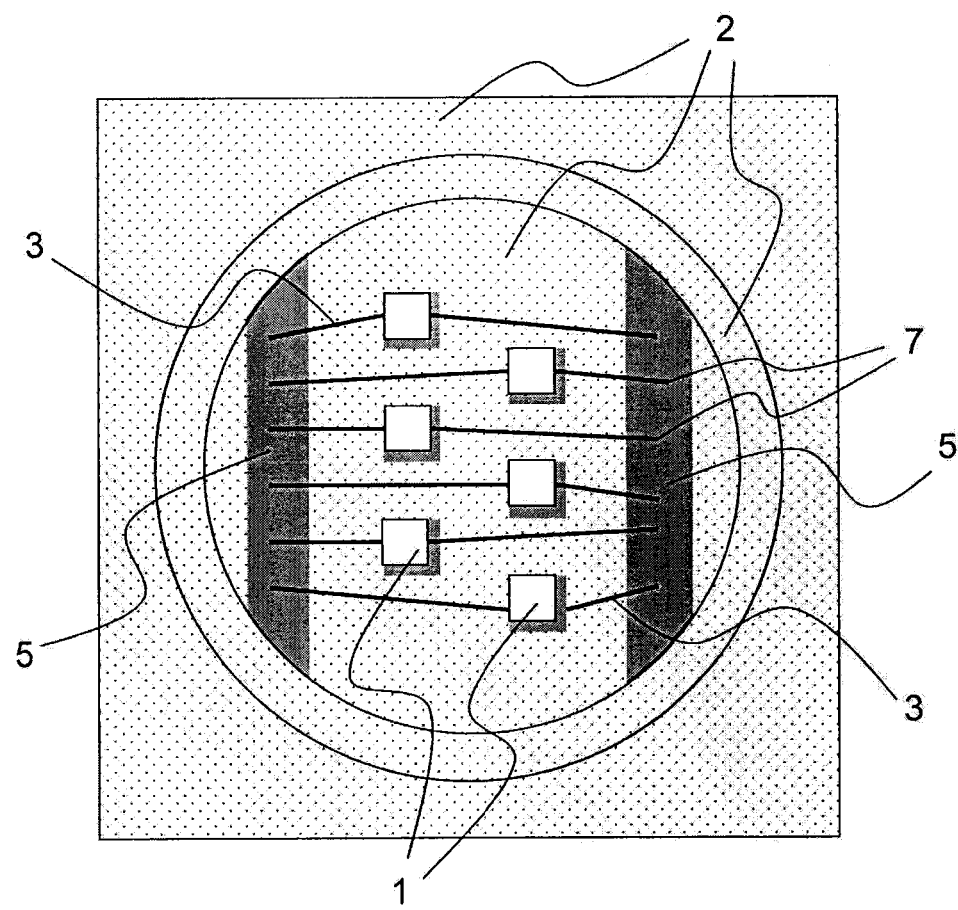
FIG. 6 is a two-dimensional diagram showing one mode of a semiconductor light-emitting device of the present invention.

The semiconductor light-emitting element 1 may be a near-ultraviolet semiconductor light-emitting element that generates light having a wavelength in the near-ultraviolet range, a violet semiconductor light-emitting element that generates light having a wavelength in the violet range, a blue semiconductor light-emitting element that generates light having a wavelength in the blue range and the like, and generates light having a peak wavelength in the wavelength range of 350 nm or higher and 520 nm or lower. In FIG. 1, only one semiconductor light-emitting element is depicted, however, a plurality of semiconductor light-emitting elements can be provided in a linear or planar manner as shown in FIG. 6. By providing the semiconductor light-emitting elements 1 in a planar manner, a planar lighting can be easily prepared and this embodiment is suitable when increased light-emitting power is desired.

The molded resin 2 included in the package is molded together with the lead frame 5 and at least a part of the lead frame 5 is in contact with the molded resin 2. The shape of the package is not particularly limited and may be a plane or cup. In order to impart directionality of light, the package preferably has a cup shape.

The lead frame 5 is a conductive metal wiring and has a role in supplying an electrical power source from outside of the semiconductor light-emitting device and providing electrical power to the semiconductor light-emitting element 1.

The bonding wire 3 fixes the semiconductor light-emitting element 1 to the package. When the semiconductor light-emitting element 1 is not in contact with the lead frame which acts as an electrode, the conductive bonding wire 3 plays a role in supplying an electrode for the semiconductor light-emitting element 1. The bonding wire 3 is adhered to the lead frame 5 by thermocompressively bonding them and applying heat and ultrasonic vibration. The lead frame 5 having a silver or silver alloy surface is preferable because the adhesiveness may be improved.

The phosphor layer 4 is a mixture of the encapsulant and a phosphor or the like and the phosphor converts excitation light from the semiconductor light-emitting element 1 to visible light. The phosphor contained in the phosphor layer 4 may be appropriately selected according to the wavelength of excitation light from the semiconductor light-emitting element 1. In the light-emitting device generating white light and having an excitation light source of a semiconductor light-emitting element generating blue excitation light, white light can be generated by including green and red phosphors in the phosphor layer. When the semiconductor light-emitting element generates violet excitation light, the phosphor layer may contain blue and yellow phosphors or blue, green and red phosphors. The phosphor layer 4 may not contain a phosphor for example when it is not necessary to convert light generated from the semiconductor light-emitting element. The phosphor layer 4 may contain other components than the encapsulant and phosphor, if necessary.

A resin which is used for the encapsulant contained in the phosphor layer 4 can be appropriately selected from translucent resins which are conventionally used for the encapsulant and may include epoxy resins, silicone resins, acrylic resins, polycarbonate resins and the like. Among these, silicone resins are preferable. The encapsulant can contain in addition to the above resin inorganic particles as a bulking agent or thixotropic material.

The refractive index of the binder resin which is used for the molded resin 2 in the package of the present invention is preferably at a similar level as the refractive index of the encapsulant contained in the phosphor layer 4. The refractive index of the encapsulant means the refractive index of the resin used for the encapsulant, namely, the refractive index of the resin itself without any additives such as inorganic particles. When, specifically, the difference in refractive index is 0.05 or less, loss of light at the interface between the molded resin 2 and the phosphor layer 4 can be prevented, so that the light-emitting device as a whole can have high brightness. The difference in refractive index between the molded resin 2 and the encapsulant contained in the phosphor layer 4 is preferably 0.03 or less and it is more preferable when the difference is close to 0 (zero) as much as possible. According to the present invention, the refractive index is measured by using sodium D line.

The refractive index of the encapsulant contained in the phosphor layer 4 is more preferably the same as or higher than the refractive index of the binder resin in the molded resin 2.

In conventional semiconductor light-emitting devices, the refractive index of the molded resin forming the package has been higher than the refractive index of the encapsulant, and therefore, light loss occurs when light entered into the molded resin escapes less through the molded resin towards the encapsulant. This results in a decreased brightness of the semiconductor light-emitting device. In order to solve this problem, various studies have been carried out in which the molded resin and the encapsulant are purposely separated, so that light is allowed to be reflected on the detached encapsulant surface instead of the molded resin surface, thereby improving the brightness. However, improvement in brightness has not been sufficient.

It has also been studied to use a metal reflector such as silver or aluminum. However, the metal reflectors are expensive and have problems such that they may rust or be discolored during use.

Accordingly, the present inventors have focused on refractive index. Namely, they have found that when refractive index of the molded resin forming the package and that of the encapsulant are at the similar level, the above problem can be solved. By employing this configuration, light does not reflect at the interface between the molded resin forming the package and the encapsulant, and therefore the brightness is improved.

The above refractive index can be fulfilled by forming both the molded resin forming the package and the encapsulant with silicone resins. The refractive index is measured as mentioned above.

The modes of the semiconductor light-emitting device according to the present invention shown in FIGS. 1 to 8 are now described.

FIG. 1 shows the semiconductor light-emitting device in which the most part of the lead frame existing at the bottom surface of the recessed part of the molded resin is not covered by the resin.

FIG. 2 shows the semiconductor light-emitting device in which the exposed area of the lead frame at the bottom surface of the recessed part of the molded resin is decreased and the reflecting material (molded resin) occupies a large area of the bottom surface. In this mode, the semiconductor light-emitting element 1 is directly mounted on the molded resin 2 and the part of the molded resin 2 on which the semiconductor light-emitting element 1 is mounted has a thickness of generally 100 μm or more and preferably 200 μm or more. It is generally not more than 3000 μm and preferably not more than 2000 μm. When the thickness is too low, reflectivity may be decreased because light transmits through the bottom surface and there may also be a problem such that the strength of the package is insufficient, resulting in deformation thereof upon handling. When the thickness is too high, the package itself may be thick and bulky to limit the application range of the semiconductor light-emitting device.

FIG. 3 shows a mode (remote phosphor mode) of the semiconductor light-emitting device in which the semiconductor light-emitting element 1 is encapsulated by the encapsulant layer 8 and the phosphor layer 9 is provided remotely from the semiconductor light-emitting element 1. As shown in this figure, such a mode is also included in the embodiments of the present invention in which the phosphor is not mixed in the encapsulant layer 8 which acts only for encapsulation and the phosphor layer is separately formed.

This mode can be produced by forming the phosphor layer 9 directly on the encapsulant layer 8 (transparent encapsulating layer) by potting or screen printing or by covering the molded resin 2 with a transparent substrate (not shown) in a separate step, forming the phosphor layer 9 thereon by screen printing or die coating and placing the product on the transparent encapsulant layer.

In case of the mode shown in FIG. 3, the semiconductor light-emitting element 1 and the phosphor layer 9 are provided with an interval therebetween. Therefore, deterioration of the phosphor layer 9 due to light energy from the semiconductor light-emitting element 1 can be prevented and the output power of the light-emitting device can also be increased. In this case, the interval between the semiconductor light-emitting element 1 and the phosphor layer 9 is generally 0.10 mm or more, preferably 0.15 mm or more and more preferably 0.18 mm or more. On the other hand, when the distance between the phosphor layer 9 and the semiconductor light-emitting element 1 is small, the size of the light-emitting device can be reduced. In terms of this, the thickness of the encapsulant layer from the upper surface of the semiconductor light-emitting element is generally 1 cm or less, preferably 5 mm or less and more preferably 1 mm or less.

It is preferable to provide the encapsulant layer 8 having translucent property at a gap between the molded resin 2 and the phosphor layer 9. The phosphor layer 9 can be executed as a multilayer structure in which the phosphor for each color used is separately coated or can be formed in a pattern such as stripes or dots in order to reduce self-reabsorption of fluorescence and reabsorption among the individual color phosphors such as between blue, green and red.

When light from the semiconductor light-emitting element 1 is directly used without wavelength conversion, a transparent encapsulant without a phosphor is used instead of the phosphor layer 9. Alternatively, the phosphor layer 9 may not be provided and the encapsulant layer 8 can be used as the phosphor layer 4 containing a phosphor.

Even in the case shown in FIG. 2, the semiconductor light-emitting element 1 and the phosphor in the phosphor layer 4 can be provided with a distance therebetween by controlling the sedimentation speed of the phosphor during encapsulation of the device by mixing the phosphor in the phosphor layer 4 with the encapsulant.

Figure 4:
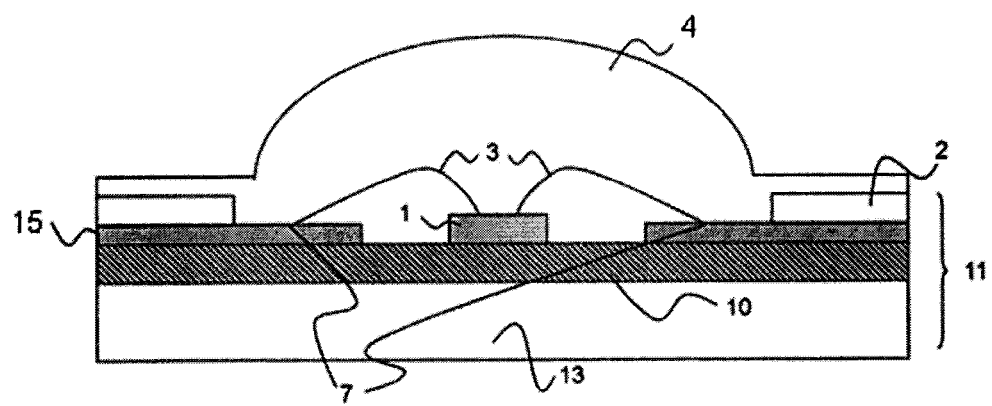
FIG. 4 is a conceptual diagram showing one mode of a semiconductor light-emitting device of the present invention.
Figure 5:
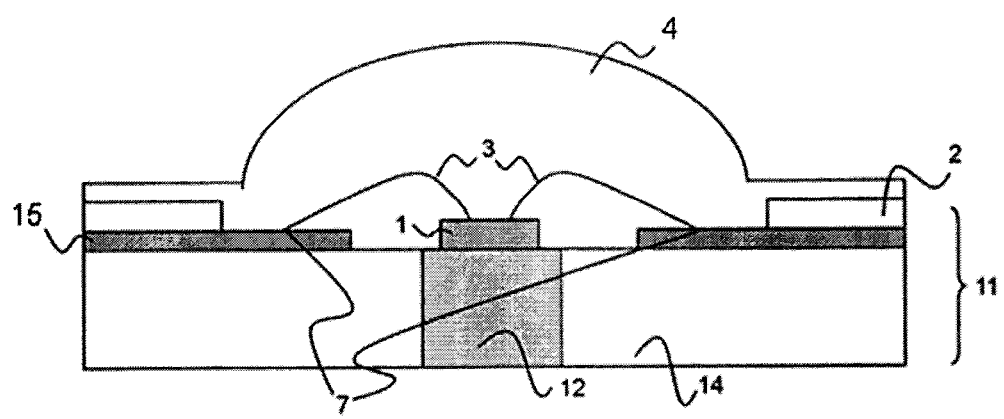
FIG. 5 is a conceptual diagram showing one mode of a semiconductor light-emitting device of the present invention.

FIGS. 4 and 5 show semiconductor light-emitting devices for implementation in chip-on-board, which do not comprise a reflector in a cup shape as shown in FIGS. 1 to 3. The shape of the package for the semiconductor light-emitting device according to the present invention may not be a cup shape and may be the shape of the molded resin 2 for implementation in chip-on-board as shown in FIGS. 4 and 5.

In these modes, a metal wiring 15 is connected to the semiconductor light-emitting element 1 via the bonding wire 3 at a connecting part 7. In these modes, a part of the metal wiring 15 is covered by the molded resin 2. The molded resin 2 also functions as an insulating layer and the thickness thereof can be increased.

A plurality of the semiconductor light-emitting elements 1 may be present. The phosphor layer 4 can collectively encapsulate a plurality of mounting parts as shown in FIG. 6 and described below. The insulating layer 10 shown in FIG. 4 may be transparent or function as a reflecting material. It is also preferable to have high heat releasing property.

A heat sink 12 shown in FIG. 5 is made of a high heat releasing material such as a metal and may be provided directly below the light-emitting element, if necessary, in order to release heat generated from the semiconductor light-emitting element 1 to the outside of the package.

When the substrate is metal as shown in FIG. 4, it may be made of a material containing aluminum or copper. The substrate made of the material containing aluminum may have an insulating transparent multilayer having a reflection enhancing structure as the insulating layer 10, which is formed by vapor deposition. The substrate shown in FIG. 5 may be made of an insulating material and formed by ceramics (AlN, $Al_2O_3$) or the molded resin of the present invention.

In the semiconductor light-emitting devices shown in FIGS. 4 and 5, the phosphor layer 4 may be a transparent layer without a phosphor.

FIG. 6 shows the mode in which a plurality of the semiconductor light-emitting elements is provided. Again, in FIG. 6, the lead frame 5 is connected to the semiconductor light-emitting elements 1 via the bonding wires 3 at connecting parts 7. The surface of the lead frame 5 other than the connecting parts 7 is covered by the molded resin 2. In this mode, again, the semiconductor light-emitting element may be encapsulated by the encapsulant layer containing a phosphor (phosphor layer 4) or the semiconductor light-emitting element may be encapsulated by the transparent encapsulant layer 8 and the phosphor layer 9 may be or may not be provided at a position separated from the semiconductor light-emitting element.

Figure 7:
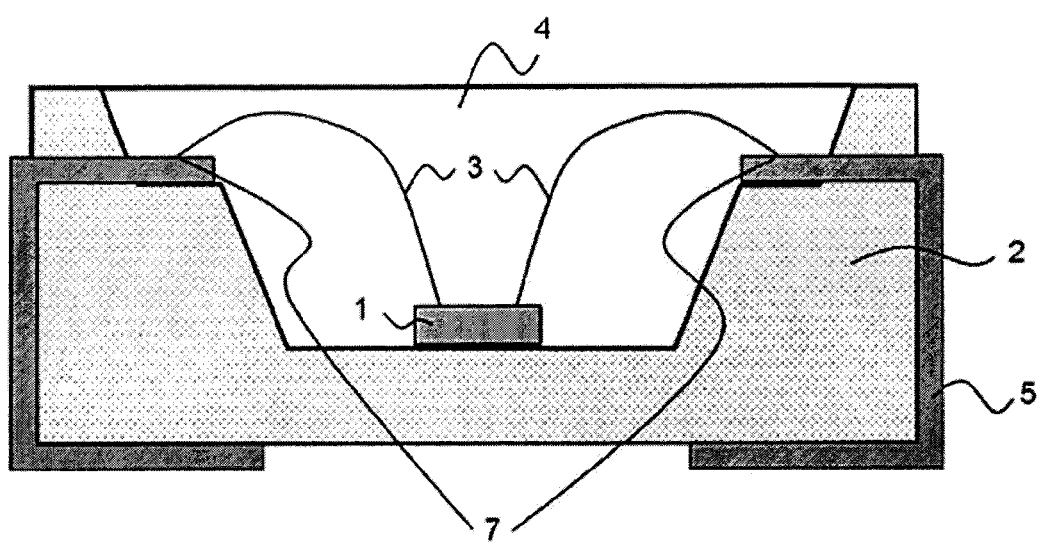
FIG. 7 is a conceptual diagram showing one mode of a semiconductor light-emitting device of the present invention.

FIG. 7 shows a package-type semiconductor light-emitting device in which the semiconductor light-emitting element is provided at the bottom surface of a cup shape formed with the molded resin 2. In this mode, the phosphor layer 4 may be a transparent layer without a phosphor and the phosphor layer 9 may be provided remotely from the semiconductor light-emitting element as shown in FIG. 3. In these modes, an exposed part of the lead frame 5 is situated at obliquely upward on the semiconductor light-emitting device and therefore receives less light from the semiconductor light-emitting element. Thus, coloration of a plated silver or the like in the lead frame 5 resulting from an electric field, heat and light from the semiconductor light-emitting element and thus reduction in brightness can be prevented.

Figure 8:
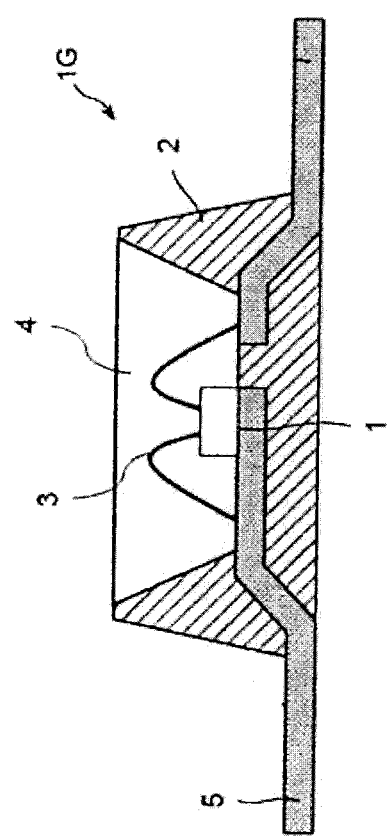
FIG. 8 is a conceptual diagram showing one mode of a semiconductor light-emitting device of the present invention.

FIG. 8 is a conceptual section diagram showing the semiconductor light-emitting device according to an embodiment of the present invention.

The semiconductor light-emitting device 1G according to such a mode comprises the package formed by the lead frame 5 and the molded resin 2, whose structure is suitable for liquid injection molding (LIM), and has the configuration having preferable heat release.

Upon molding of the package of the present invention, the resin used for the molded resin may be difficult to be released from a mold because the rein is softer and has higher tackiness compared to the conventional engineering plastic resins, or may cause prevention of continuous molding because a thin part of the molding may be separated and remained in the mold upon release from the mold. In order to address these problems, the upper edges of a side reflector part or the corners of the package preferably have a polled shape close to a rounded surface. The inner and outer wall surfaces of the reflector are preferably sloped at around 3±1 degrees from the line perpendicular to the bottom surface of the package so that the reflector becomes thinner with distance from the bottom surface of the package. In the lead frame-type, the lead may sometimes be detached and dropped from the molding due to torsional external force applied to the package during molding, release from a mold, transfer of package pieces by a parts feeder/robot arm and mounting of the light-emitting element. Therefore, it is preferable that positive and negative inner leads are mutually indented at the bottom surface of the package such as concavity and convexity as seen above the package, for example, so that they have a strong structure against torsional stress or local stress upon wire bonding. Moreover, the lead frame preferably has a structure in which the area sandwiched by the molding at the upper and lower surfaces is large. In the embodiment shown in FIG. 8, molded resin at the side and bottom parts sandwiches the outer lead.

The lead frame is preferably bent preliminarily because it is less damaged by avoiding application of stress to the interface between the package and the lead frame compared to the case when the lead frame is subjected to bending process after molding. The outer lead according to this embodiment is preliminarily bent to the final shape and the back side of the outer lead is on the same plane as the face where the package is mounted, so that mounting stability is high and heat release is preferable.

Figure 9:
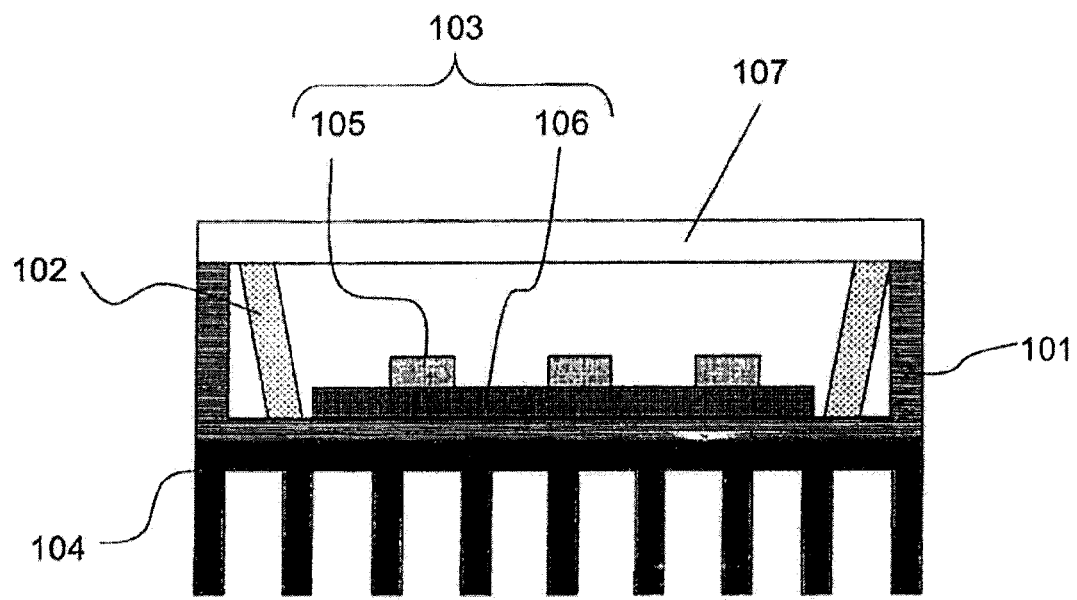
FIG. 9 is a diagram showing one mode of a lighting device including a semiconductor light-emitting device of the present invention.

The semiconductor light-emitting devices shown in FIGS. 1 to 8 using the packages for a semiconductor light-emitting device of the present invention can be suitably used as a light-emitting component 105 of a lighting device shown in FIG. 9. When the above semiconductor light-emitting device is used in such a mode, it is usual to use the one which is encapsulated with only encapsulant without a phosphor.

The lighting device shown in FIG. 9 is formed by a housing 101 with a window, a reflector component 102, a light source component 103 and a heat sink 104. The light source component 103 comprises the light-emitting component 105 on a circuit substrate 106 which corresponds to the circuit substrate 11 shown in FIGS. 4 and 5, and the light source component 103 may be any form such as a COB (chip-on-board) form in which the semiconductor light-emitting element 1 is directly mounted on the circuit substrate 11 or the circuit substrate 11 with the heat sink 12 or a surface-mounted form shown in FIGS. 1, 2, 3 and 7. When the light source component 103 is in the COB form, the semiconductor light-emitting element may be encapsulated by an encapsulant resin molded in a dome shape or plane shape without a frame material as shown in FIGS. 4 and 5. A single semiconductor light-emitting element or a plurality of semiconductor light-emitting elements may be mounted on the circuit substrate 106. The reflector component 102 and the heat sink 104 may be formed into a single body with the housing 101 or may each be separated therefrom and can be used as required. Viewed from the perspective of thermal radiation, the light source component 103, the housing 101, and the heat sink 104 preferably have a single body structure or are in gapless contact intermediated by a high thermal conductivity sheet or grease. For example, a known transparent resin or optical glass can be used for the window 107, and this window 107 may have a flat shape or may have a curved surface.

In the case of a phosphor-based white LED, the phosphor component may be disposed at the light source component 103 or may be disposed at the window 107. The disposition at the window 107 enables the phosphor to be placed at a position that is separated from the light-emitting element and thus offers the advantage of inhibiting deterioration of the phosphor, which is readily degraded by heat and light, and thereby making it possible to obtain uniform, high luminance white light on a long-term basis.

When a phosphor layer is disposed at the window 107, production can be carried out by a method in which the phosphor layer is, for example, screen printed, die coated, or spray coated on (not shown) a transparent window material. The distance between the semiconductor light-emitting element and the phosphor layer of the window 107 is preferably from 5 to 50 mm.

In this case, in order to reduce self-reabsorption and reabsorption among the individual RGB phosphors, the phosphor layer can be executed as a multilayer structure in which the phosphor for each color used is separately coated or can be formed in a pattern such as stripes or dots.

The shape of each feature of the lighting device is not limited to that shown in the figure, and the device may be fabricated, for example, with a curved surface feature or as necessary with an attached dimmer or circuit protection device.

In the lighting device described and shown in FIG. 9, the molded resin contained in the package for a semiconductor light-emitting device of the present invention can also be used for each of the housing 101, the reflector component 102, the light source component 103, the light-emitting component 105 and the circuit substrate 106, for example. The molded resin exhibits a high reflectivity for ultraviolet-to-visible light and an excellent heat resistance and light resistance, and in consequence thereof can inexpensively provide a highly durable high-luminance lighting device in which the required number of semiconductor light-emitting elements has been brought down.

In particular, through its high reflectivity for ultraviolet-to-blue light, the molded resin of a package for a semiconductor light-emitting device of the present invention can effectively reflect the light generated from the semiconductor light-emitting element prior to wavelength conversion by the phosphor and is thus well adapted for embodiments in which the phosphor layer is positioned at a location separated from the light source component. When the emitted light color of the semiconductor light-emitting element is ultraviolet to near-ultraviolet, the main component of the filler (B) is preferably alumina, while in the case of a blue emitted light color the main component is preferably alumina and/or titania.

Example

The present invention is described in further detail hereinbelow with examples which do not limit the present invention in any extent.

Production of White Resin Composition and Molded Resin

Example 1

A polyethylene container was charged with 6.0 g alumina (average particle diameter of secondary particles: 1.2 µm, average aspect ratio of primary particles: 1.48), 0.47 g surface-treated (trimethylsilyl-treated) fumed silica, 3.04 g non-phenyl containing silicone (containing vinyl group at 0.3 mmol/g and platinum at 8 ppm, viscosity at normal temperature: 3700 cp; this silicone is hereinafter referred to as "non-phenyl containing silicone E"), 0.30 g non-phenyl containing silicone (containing vinyl group at 0.1 mmol/g and hydrosilyl group at 4.6 mmol/g, viscosity at normal temperature: 600 cp; this silicone is hereinafter referred to as "non-phenyl containing silicone F"), and 0.15 g non-phenyl containing silicone (containing vinyl group at 0.2 mmol/g, hydrosilyl group at 0.1 mmol/g and alkynyl group at 0.2 mmol/g, viscosity at normal temperature: 500 cp; this silicone is hereinafter referred to as "non-phenyl containing silicone G") containing a curing retarding component (catalyst controlling component), which were stirred by Thinky mixer (AWATORI RENTARO) followed by stirring with a polypropylene spatula. After further subjecting to the foam separation under vacuum, a white resin composition 1 was obtained. The white resin composition 1 had the molar ratio of SiH to Si(CHCH$_2$), SiH/Si(CHCH$_2$) of 1.3 as a nominal composition.

The resulting white resin composition 1 was molded into a diameter of about 1 cm and a thickness of about 1 mm on a silver plate with a stainless metal mold and heated and compressed under pressure of 10 kg/cm$^2$ at 150° C. in air for 3 minutes to give a molded resin 1.

The resulting molded resin was subjected to IR measurement under the following conditions to determine the intensity ratio of 2167 cm$^{-1}$/2904 cm$^{-1}$. Based on a calibration curve preliminarily generated, the amount of SiH existing was calculated.
Conditions for IR measurement:
Instrument used: Varian infrared spectrometer, FTS-7000:
Measurement condition: rapid scan method;
Transmission measurement by scanning on a normal IR interferometer;
Detector: MCT Detector;
Scanning frequency: 20 kHz; and
Resolution: 4 cm$^{-1}$.

The amount of SiH existing in the molded resin 1 was 44 µmol/g.

The molded resin 1 on the silver plate was not detached therefrom by applying force in some extent from the side with the spatula.

Example 2

A white resin composition 2 was prepared in the similar manner as described in example 1 except that 2.89 g of the non-phenyl containing silicone E and 0.46 g of the non-phenyl containing silicone F were added. The composition was molded to give a molded resin 2. The white resin composition 2 had the molar ratio of SiH to Si(CHCH$_2$), SiH/Si(CHCH$_2$) of 2.0 as a nominal composition.

The amount of SiH existing in the molded resin 2 was 90 tµmol/g.

The molded resin 2 on the silver plate was not detached therefrom by applying force in some extent from the side with the spatula.

Example 3

A white resin composition 3 was prepared in the similar manner as described in example 1 except that 5.23 g of alumina was added and 0.80 g rutile-type titania which was thin-film surface coated with silica and alumina (primary particle diameter: 0.3 µm, average aspect ratio of primary particles: 1.45) was added. The composition was molded to give a molded resin 3. The white resin composition 3 had the molar ratio of SiH to Si(CHCH$_2$), SiH/Si(CHCH$_2$) of 1.3 as a nominal composition.

The amount of SiH existing in the molded resin 3 was 49 µmol/g.

The molded resin 3 on the silver plate was not detached therefrom by applying force in some extent from the side with the spatula, although a slight lift from the silver plate was observed.

Comparative Example 1

A white resin composition 4 was prepared in the similar manner as described in example 1 except that 3.10 g of the non-phenyl containing silicone E and 0.24 g of the non-phenyl containing silicone F were added. The composition was molded to give a molded resin 4. The white resin composition 4 had the molar ratio of SiH to Si(CHCH$_2$), SiH/Si(CHCH$_2$) of 1.0 as a nominal composition.

The amount of SiH existing in the molded resin 4 was 24 mmol/g.

The molded resin 4 on the silver plate was easily detached therefrom by applying force from the side with the spatula.

Comparative Example 2

A white resin composition 5 was prepared in the similar manner as described in example 1 except that 2.68 g of the non-phenyl containing silicone E and 0.67 g of the non-phenyl containing silicone F were added. The composition was molded to give a molded resin 5. The white resin composition 5 had the molar ratio of SiH to Si(CHCH$_2$), SiH/Si(CHCH$_2$) of 3.1 as a nominal composition.

The amount of SiH existing in the molded resin 5 was 126 µmol/g.

The molded resin 5 on the silver plate was not detached therefrom by applying force in some extent from the side with the spatula, although a slight lift from the silver plate was observed.

<Measurement of Reflectivity>

The white resin compositions 1 to 5 obtained in the above examples and comparative examples were molded to prepare molded resins 6 to 10 having a plate thickness of about 0.5 mm. A molded resin 11 having a plate thickness of 2000 μm was also prepared by using a polyphthalamide resin, Amodel A4122 from Solvay Advanced Polymers K.K. as an amide resin composition.

Reflectivities (%) of light at wavelengths of 360 nm, 400 nm, 420 nm, 440 nm and 460 nm were measured with SPECTROPHOTOMETER CM-2600d from Konica Minolta for the molded resins 6 to 10 at a measurement diameter of 3 mm and for the molded resin 11 at a measurement diameter of 6 mm, respectively. The measurement results are shown in Table 1.

TABLE 1

|  |  | Reflectivity | | | | |
| --- | --- | --- | --- | --- | --- | --- |
|  |  | 360 nm | 400 nm | 420 nm | 440 nm | 460 nm |
| Molded resin 6 | Example 1 | 92.7 | 95.4 | 95.5 | 95.6 | 95.8 |
| Molded resin 7 | Example 2 | 92.2 | 95.2 | 95.5 | 95.6 | 96.1 |
| Molded resin 8 | Example 3 | 8.3 | 46.5 | 91.5 | 96.2 | 96.7 |
| Molded resin 9 | Comparative Example 1 | 92.9 | 94.5 | 94.4 | 94.3 | 94.6 |
| Molded resin 10 | Comparative Example 2 | 91.2 | 94.6 | 94.7 | 94.8 | 95.3 |
| Molded resin 11 | — | 8.8 | 43.3 | 79.8 | 84.4 | 86.6 |

Production of Package for Semiconductor Light-Emitting Device

Example 4

The white resin composition 1 of example 1 and a copper lead frame plated with silver on whole surface were used in liquid injection molding to prepare a cup-shaped, surface mount type package 1 which had a length of 5 mm, width of 5 mm and height of 1.5 mm and had a recessed part with an opening diameter of 3.6 mm as shown in FIG. 2. Molding was carried out at 150° C. and 500 kg/cm² for a curing time of 20 seconds.

The amount of SiH existing in the resulting surface mount type package 1 was 38 μmol/g.

Comparative Example 3

A polyphthalamide resin, Amodel A4122 from Solvay Advanced Polymers K.K., as an amide resin composition and the copper lead frame plated with silver on whole surface as used in example 4 were used to mold a cup-shaped surface mount type package 2 which had a length of 5 mm, width of 5 mm and height of 1.5 mm and had a recessed part with an opening diameter of 3.6 mm. The package 1 of example 4 and the package 2 of comparative example 3 had exactly the same shape.

Example 5

The white resin composition 1 of example 1 and the copper lead frame plated with silver on while surface were used in liquid injection molding to mold a cup-shaped, surface mount type package 3. Molding was carried out under the same conditions as example 4 (150° C., 500 kg/cm², curing time 20 seconds). The package had a cup shape shown in FIG. 8, i.e. had a resin part having a length of 3.2 mm, width of 2.7 mm and height of 1.4 mm and a recessed part with an opening diameter of 2.4 mm.

For the molded package, no burr was observed and the package had no problem for short molding or stick in mold. The amount of SiH existing in the resulting surface mount type package 3 is believed to be the same value as example 4 (38 μmol/g) because molding was carried out under the same conditions as example 4.

The molded package was sectioned with a microtome while frozen with liquid nitrogen and the package cross section was observed by SEM. The primary particle diameter of alumina exposed on the cross section was 0.3 μm and the aspect ratio of primary particles was 1.48.

Comparative Example 4

A commercial cup-shaped package which was obtained by molding a polyphthalamide resin, Amodel A4122 from Solvay Advanced Polymers K.K., contained a copper lead frame plated with silver on whole surface and had a resin part having a length of 3.2 mm, width of 2.7 mm and height of 1.4 mm and a recessed part with an opening diameter of 2.4 mm was used as a comparative surface mount type package 4.

<Amount of SiH Existing after Heating at 200° C. For 10 Minutes>

Sample pieces of the molded resins 1 to 5 and the surface mount type package 1 obtained as described above were heated at 200° C. for 10 minutes and measured for the amount of SiH existing according to the above measurement conditions. The measurement results are shown in Table 2.

The package 1 of example 4 was further heated at 200° C. for 10 minutes (i.e. heated twice at 200° C. for 10 minutes) followed by measurement of the amount of SiH existing according to the above measurement conditions. The measurement results are shown in Table 2. It is found that further heating of the molded resin or package after heating at 200° C. for 10 minutes did not significantly change the amount of SiH existing.

TABLE 2

|  |  |  | Amount of SiH existing (μmol/g) | | |
| --- | --- | --- | --- | --- | --- |
|  |  | Sample Geometry | Before heating[X] | After heating | Further heating |
| Molded resin 1 | Example 1 | Sample pieces | 44 | 33 | 23 |
| Molded resin 2 | Example 2 | Sample pieces | 90 | 51 |  |
| Molded resin 3 | Example 3 | Sample pieces | 49 | 34 |  |
| Surface mount type package 1 | Example 4 | Package | 38 | 25 |  |
| Molded resin 4 | Comparative Example 1 | Sample pieces | 24 | 16 |  |
| Molded resin 5 | Comparative Example 2 | Sample pieces | 126 | 72 |  |

[X]State after manufacturing molded resin by heating and compression

<Measurement of Resin Extrusion Amount Upon Molding by Heating and Compression>

The white resin compositions 1 to 5 obtained in the above examples and comparative examples were measured for the resin extrusion amount upon molding by heating and compression. Namely, a through hole (diameter: 13 mm) on a stainless plate having a thickness of 0.3 mm was charged with the sample at 80% by volume and was covered with a polyimide film, which was then subjected to heating and pressing in a heat press at 150° C. and 165 kg/cm$^2$ for 3 minutes. The longest distance from the edge of the material extruded from the through hole to the edge of the through hole after the heating and pressing was measured. When a portion of the material was not reached to the edge of the through hole, the longest distance to the edge of the material was recorded as a negative value. The measured value of less than −2 mm may give a tendency of generation of short shot during molding and the measured value of more than 3 mm may give a tendency of so-called burring during molding.

The results are shown in Table 3. The white resin compositions 1 to 3 of the present invention showed the resin extrusion amounts in a preferable range. On the other hand, the white resin composition 4 of comparative example had high resin extrusion amount and the white resin composition 5 of comparative example had, despite of low resin extrusion amount, generation of foams during molding, resulting in the judgment as inappropriate as a molded resin material.

TABLE 3

| | | Extrusion amount (mm) |
|---|---|---|
| White resin composition 1 | Example 1 | 2.3 |
| White resin composition 2 | Example 2 | 0.7 |
| White resin composition 1 | Example 3 | −0.9 |
| White resin composition 4 | Comparative Example 1 | 3.4 |
| White resin composition 5 | Comparative Example 2 | −0.8 |

<Production of Light-Emitting Device 1>

Light-emitting devices were fabricated as follows with the surface mount type package 1 of example 4 and the surface mount type package 2 of comparative example 3.

A semiconductor light-emitting element (rated current: 20 mA) having an emission wavelength of 406 nm was placed at a predetermined position on an inner lead exposed at a recessed part of the package via a silicone die-bond material (KER-3000-M2 from Shin-Etsu Chemical Co., Ltd.) and the silicone die-bond material was cured at 100° C. for 1 hour and further at 150° C. for 2 hours. After mounting the semiconductor light-emitting element on the package as above, the lead frame in the package and the semiconductor light-emitting element were connected with a gold wire.

Next, the semiconductor light-emitting element was encapsulated as follows to produce a semiconductor light-emitting device.

(1) Production of Encapsulant

Both-end silanol-terminated dimethyl silicone oil XC96-723 from Momentive Performance Materials Japan (385 g), 10.28 g methyltrimethoxysilane and 0.791 g zirconium tetraacetylacetonate powder as a catalyst were weighed in a 500-ml three-neck flask equipped with an impeller, a fractionating column, a jacketed coil condenser and a Liebig condenser and stirred at room temperature for 15 minutes until coarse particles of the catalyst were dissolved. The reaction solution was then heated to 100° C. to completely dissolve the catalyst and stirred at 100° C. under total reflux for 30 minutes at 500 rpm for initial hydrolysis.

Then, the distillate side was connected to the Liebig condenser and the reaction solution was stirred at 100° C. and 500 rpm for 1 hour while distilling out the produced methanol, water and by-products, low-boiling silicon components, with nitrogen introduced into the solution at SV20. The solution was further heated to 130° C. with introduction of nitrogen at SV20 and maintained at this temperature for 5 hours to continue the polymerization reaction, resulting in the reaction solution having viscosity of 120 mPa·s. "SV" is an abbreviation of "Space Velocity" and refers to the injected volume per unit time. Thus, SV20 refers to injection of $N_2$ at a volume of 20 times of the volume of the reaction solution per hour.

After the injection of nitrogen was terminated and the reaction solution was once cooled down to room temperature, the reaction solution was transferred to a pear-shaped evaporating flask and a trace amount of methanol, water and low-boiling silicon components was distilled out using a rotary evaporator on an oil bath at 120° C. and 1 kPa for 50 minutes to give an encapsulant fluid without solvent having viscosity of 230 mPa·s (refractive index: 1.41).

(2) Encapsulation of Semiconductor Light-Emitting Element

The above encapsulant was added dropwise to the recessed parts of the packages of example 4 and comparative example 3 to the same level as the upper edge of the opening, followed by curing with heating at 90° C. for 2 hours, 110° C. for 1 hour and then 150° C. for 3 hours in a thermostatic chamber to encapsulate the semiconductor light-emitting element.

<Measurement of Initial Radiant Flux>

The semiconductor light-emitting devices produced with the surface mount type package 1 of example 4 and the surface mount type package 2 of comparative example 3 as described above were placed in a lamp power supply, driving current of 20 mA was applied and initial radiant flux (light output) 10 seconds after the lighting-up was measured. The results are shown in Table 4. Radiant flux after encapsulation was significantly improved for the light-emitting device including the surface mount type package 1 of example 4 which had small difference in refractive index.

Radiant flux was measured with a spectrometer "USB2000" from Ocean Optics, Inc. (wavelength integration range: 350 to 800 nm, light receiving system: integrating sphere with 100 m$) while the spectrometer itself was maintained in a thermostatic chamber at 25° C. In order to prevent elevation in temperature of the light-emitting device, heat was released with an aluminum plate having a thickness of 3 mm placed via a heat-conductive insulating sheet.

In Table 4, refractive indexes of the binder resin (the resin used for the molded resin part of the package) and the encapsulant produced as described above were measured with an Abbe refractometer.

TABLE 4

|  | Light output (mW) | | Refractive index of the binder resin | Difference in refractive index between binder resin and encapsulant |
| --- | --- | --- | --- | --- |
|  | In the absence of encapsulant | In the presence of encapsulant | | |
| Light-emitting device including the surface mount type package 1 of Example 4 | 46.0 | 56.0 | 1.41 | 0.00 |
| Light-emitting device including the surface mount type package 2 of Comparative Example 3 | 41.4 | 40.5 | 1.53 | 0.12 |

<Production of Light-Emitting Device 2>

Five different kinds of light-emitting devices including the surface mount type package 3 of example 5 or the surface mount type package 4 of comparative example 4 were respectively fabricated as follows. Namely, the light-emitting devices in which each one of the semiconductor light-emitting elements having peak emission wavelengths at 360 nm, 406 nm and 460 nm was respectively encapsulated in the package with a transparent (clear) manner and the light-emitting devices in which either of the semiconductor light-emitting elements having peak emission wavelengths at 406 nm and 460 nm was respectively encapsulated in the package using a phosphor paste were produced for respective packages.

One semiconductor light-emitting element (rated current: 20 mA) was placed at a predetermined position on an inner lead exposed at the recessed part of the package via a silicone die-bond material (KER-3000-M2 from Shin-Etsu Chemical Co., Ltd.) and the silicone die-bond material was cured at 100° C. for 1 hour and further at 150° C. for 2 hours. After mounting the semiconductor light-emitting element on the package as above, the lead frame in the package and the semiconductor light-emitting element were connected with a gold wire.

[Transparent (Clear) Encapsulation]

The same encapsulant as used in the above <Production of light-emitting device 1> was added dropwise to the recessed parts of the packages of the light-emitting devices produced as described above to the same level as the upper edge of the openings, followed by curing with heating at 90° C. for 2 hours, 110° C. for 1 hour and then 150° C. for 3 hours in a thermostatic chamber to encapsulate the semiconductor light-emitting element in a transparent (clear) manner. In this way, semiconductor light-emitting devices (total: 6) containing the respective semiconductor light-emitting elements of 360 nm, 406 nm and 460 nm were produced for each of the surface mount type package 3 of example 5 and the surface mount type package 4 of comparative example 4.

[Production of Phosphor Paste]
(Production of Phosphor Paste for 406-nm Semiconductor Light-Emitting Element)

The same encapsulant as used in <Production of light-emitting device 1> was mixed with a red phosphor CaAlSi(ON)$_3$:Eu and a blue phosphor BaMgAl$_{10}$O$_{17}$:Eu from Mitsubishi Chemical Corporation, a green phosphor (Si,Al)$_6$(O,N)$_8$:Eu (β-sialon) from Denki Kagaku Kogyo K.K. and AEROSIL RX-200 from Evonik Industries as a thixotropic material to obtain a phosphor paste for the 406-nm light emitting element.

(Production of Phosphor Paste for 460-nm Semiconductor Light-Emitting Element)

The same encapsulant as used in <Production of light-emitting device 1> was mixed with a red phosphor CaAlSiN$_3$:Eu, a green phosphor CaSc$_2$O$_4$:Ce from Mitsubishi Chemical Corporation and AEROSIL RX-200 from Evonik Industries as a thixotropic material to obtain a phosphor paste for the 460-nm light emitting element.

[Encapsulation with Phosphor Paste]

Two semiconductor light-emitting devices emitting white light and containing the 406-nm semiconductor light-emitting element for each of the surface mount type package 3 of example 5 and the surface mount type package 4 of comparative example 4 were produced in the same manner as described in the above [Transparent (clear) encapsulation] except that the packages of the light-emitting devices containing the 406-nm semiconductor light-emitting elements produced as described above were encapsulated using the above phosphor paste for the 406-nm semiconductor light-emitting element.

Further, two semiconductor light-emitting devices emitting white light and containing the 460-nm semiconductor light-emitting element for each of the surface mount type package 3 of example 5 and the surface mount type package 4 of comparative example 4 were produced in the same manner as described in the above [Transparent (clear) encapsulation] except that the packages of the light-emitting devices containing the 460-nm semiconductor light-emitting elements produced as described above were encapsulated using the above phosphor paste for the 460-nm semiconductor light-emitting element.

<Measurement of Initial Radiant Flux>

Six semiconductor light-emitting devices which were produced in the above <Production of light-emitting device 2> and in which the light-emitting elements were encapsulated in the surface mount type package 3 of example 5 and the surface mount type package 4 of comparative example 4 were placed in a lamp power supply, driving current of 60 mA was applied and initial radiant flux (light output) 20 seconds after the lighting-up was measured. The results are shown in Table 5.

Radiant flux was measured with a spectrometer "USB2000" from Ocean Optics, Inc. (wavelength integration range: 350 to 800 nm, light receiving system: integrating sphere with 100 mmφ) while the spectrometer itself was maintained in a thermostatic chamber at 25° C. In order to prevent elevation in temperature of the light-emitting device, heat was released with an aluminum plate having a thickness of 3 mm placed via a heat-conductive insulating sheet.

TABLE 5

| Light output (mW) | emission wavelength(nm) driving current(mA) | 360 60 | 406 60 | 460 60 |
|---|---|---|---|---|
| Light-emitting device including the surface mount type package 3 of Example 5 | | 4.8 | 146 | 91.6 |
| Light-emitting device including the surface mount type package 4 of Comparative Example 4 | | 2.5 | 97.1 | 89 |

<Continuous Lighting Test>

The light-emitting devices (total: 4) which were produced in the above <Production of light-emitting device 2> and in which the semiconductor light-emitting element having a peak emission wavelength at 406 nm or 460 nm was encapsulated in a transparent (clear) manner in the surface mount type package 3 of example 5 or the surface mount type package 4 of comparative example 4 and the light-emitting devices (total: 4) in which the semiconductor light-emitting element having a peak emission wavelength at 406 nm or 460 nm was encapsulated using the phosphor paste were placed in a lamp power supply and driving current of 60 mA was applied in an environmental test chamber at 85° C. and relative humidity of 85% to carry out the continuous lighting test. The semiconductor light-emitting device was taken out at a predetermined interval of time and percentage of radiant flux (mW) over time relative to the initial radiant flux (mW) (radiant flux maintenance rate) was measured offline. In the white light-emitting device having the phosphors, total luminous flux (Lm) was used, namely, total luminous flux maintenance rate between before and after the test was evaluated.

Total flux was measured by the similar method as the above measurement method of initial radiant flux. The results are shown in FIG. 10.

Figure 10:
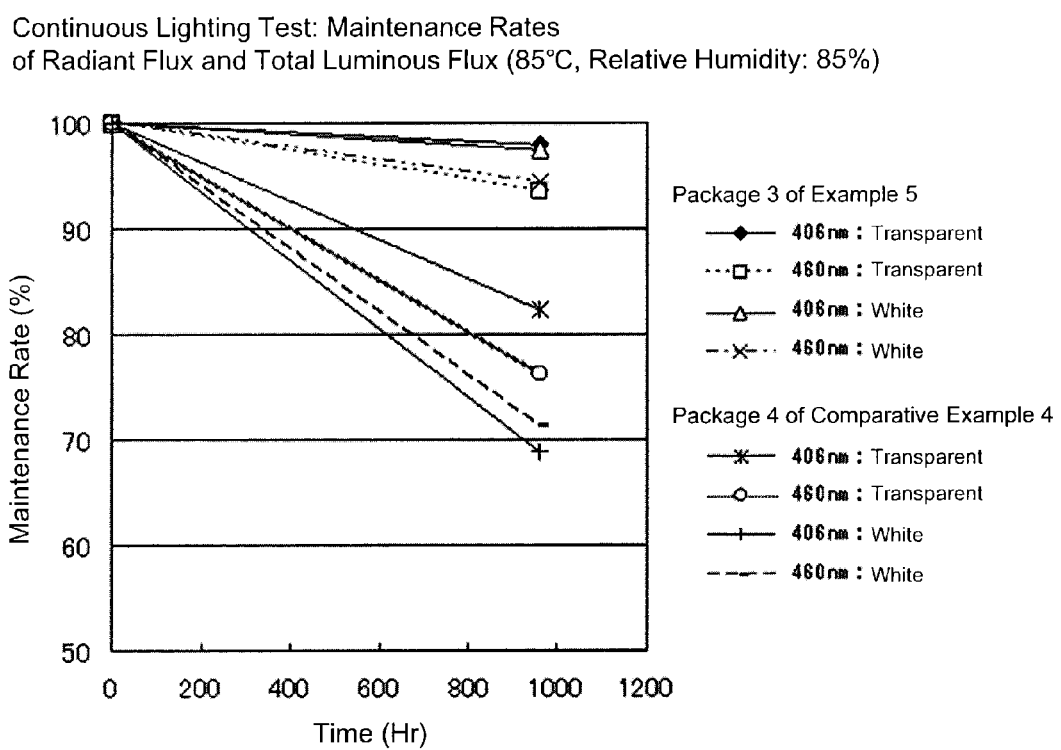
FIG. 10 is a graph showing results of a continuous lighting test of a semiconductor light-emitting device of the present invention.

As shown in Table 5 and FIG. 10, the transparent-encapsulated semiconductor light-emitting devices containing the surface mount type package 3 of example 5 showed higher radiant fluxes at both 406 nm and 460 nm than the conventional configurations of the semiconductor light-emitting devices containing the surface mount type package 4 of comparative example 4, as well as could maintain high radiant flux for a prolonged time in the continuous lighting test. When they were used as white LEDs using the phosphors, they could also maintain high total luminous flux for a prolonged time.

<Reflectivity Due to Difference in Refractive Index Between Molded Resin and Encapsulant>

In order to investigate an optimal difference in refractive index between the molded resin forming the package and the encapsulant, the following optical simulation study was carried out.

The optical simulation was carried out with LightTools from Optical Research Associates (U.S.A.).

The configuration was arranged with a light source, a plate-shaped molded resin as a reflecting material, a transparent encapsulating material (encapsulant) attached to the reflecting material and a detector which receives light at a distance. Both the light source and the detector were provided in the encapsulating material. The light source should generate light having a certain wavelength, which is assumed to enter the reflecting material according to Lambertian model. The light source itself was not specified with its material and therefore should be assumed to have no reflection or refraction.

The plate-shaped reflecting material was arranged to have the dimension sufficiently bigger than the thickness of the plate.

The resins used for both the reflecting material (molded resin) and encapsulant were set to be polyorganosiloxanes, with the reflecting material having a model in which alumina particles are homogeneously dispersed while the encapsulant having a model in which particles are not dispersed. The optical constant such as the refractive index of the polyorganosiloxane was calculated based on the observed values. The refractive index of alumina was the value generally known and average particle diameter and particle diameter distribution were observed values. The concentration of particles was arbitrarily determined.

For the calculations, a million beams are generated from the light source to enter the surface of the reflecting material. The surface of the reflecting material is assumed to be optically flat. Multiple scattering of the light transmitted the surface of the reflecting material and entered in the reflecting material is repeated due to collision to the particles. Depending on the concentration or thickness of particles, light may be not only reflected towards the light incident direction but also transmitted towards the opposite side. Based on these calculations, light beams entered into the light receiver located at a distance were integrated to measure the reflectivity.

The results obtained by varying the difference in refractive index calculated by subtracting the refractive index of the encapsulant from the refractive index of the binder resin used in the reflecting material (molded resin) are shown in Table 6.

TABLE 6

| Difference in refractive index | Reflectivity (%) |
|---|---|
| 0.00 | 96.6 |
| 0.15 | 96.1 |
| 0.30 | 95.7 |

According to the results of the simulation, it can be confirmed that the reflectivity is increased when the difference in refractive index between the binder resin used in the reflecting material (molded resin) and the encapsulant is low. When the difference in refractive index is high, repeated multiple reflection of the light entered from the encapsulant to the reflecting material (molded resin) at the interface of the encapsulant and the reflecting material (molded resin) causes light attenuation, resulting in low reflectivity. To the contrary, when the difference in refractive index is low, light attenuation due to this multiple reflection seldom occurs, and therefore high reflectivity can be obtained.

The invention has been described in detail and with reference to specific embodiments thereof, it will be apparent to one skilled in the art that various changes and modifications can be made therein without departing from the spirit and scope thereof.

EXPLANATION OF REFERENCE NUMERALS

1 Semiconductor light emitting element
2 Molded resin
3 Bonding wire
4 Encapsulant layer containing phosphor (phosphor layer)
5 Lead frame
6 Thickness of covered reflecting material
7 Connecting part
8 Encapsulant layer
9 Window (phosphor layer)
10 Insulating layer
11 Circuit substrate
12 Heat sink
13 Metal substrate
14 Insulating substrate 15 Metal wiring
101 Housing
102 Reflector component
103 Light source component
104 Heat sink
105 Light-emitting component
106 Circuit substrate
107 Window

The invention claimed is:

1. A package for a semiconductor light-emitting device comprising at least a molded resin containing (A) a SiH-containing polyorganosiloxane and (B) a filler,
wherein an amount of SiH existing in the molded resin, after a heat treatment thereof at 200° C. for 10 minutes, is 20 to 65 μmol/g.

2. The package for a semiconductor light-emitting device according to claim 1, wherein the package further comprises a metal wiring and at least a part of the metal wiring contacts the molded resin.

3. The package for a semiconductor light-emitting device according to claim 1, wherein the molded resin has, at a thickness of 0.5 mm, a reflectivity of 60% or higher for light at a wavelength of 460 nm.

4. The package for a semiconductor light-emitting device according to claim 1, wherein the molded resin has, at a thickness of 0.5 mm, a reflectivity of 60% or higher for light at a wavelength of 400 nm.

5. The package for a semiconductor light-emitting device according to claim 1, wherein the filler (B) comprises alumina and/or titania.

6. The package for a semiconductor light-emitting device according to claim 5, wherein the filler (B) has a primary particle diameter of 0.1 μm or more and 2 μm or less, and an aspect ratio of primary particles thereof is 1.0 or more and 4.0 or less.

7. The package for a semiconductor light-emitting device according to claim 1, wherein the SiH-containing polyorganosiloxane (A) is obtained by mixing a SiH-containing organosilicic compound and a Si(CHCH$_2$)-containing organosilicic compound so as to obtain an equivalent ratio of SiH and Si(CHCH$_2$), SiH/Si(CHCH$_2$), of 0.9 to 2.5.

8. A package for a semiconductor light-emitting device comprising at least a molded resin containing (A) a SiH-containing polyorganosiloxane and (B) a filler,
wherein an amount of SiH existing in the molded resin is 30 to 120 μmol/g.

9. A semiconductor light-emitting device comprising at least a semiconductor light-emitting element, the package according to any one of claims 1 to 8 and an encapsulant.

10. The semiconductor light-emitting device according to claim 9, wherein a difference in reflectivity between a binder resin used in the molded resin and the encapsulant is 0.05 or less.

* * * * *

UNITED STATES PATENT AND TRADEMARK OFFICE
CERTIFICATE OF CORRECTION

| | | |
|---|---|---|
| PATENT NO. | : 8,975,657 B2 | Page 1 of 1 |
| APPLICATION NO. | : 13/665696 | |
| DATED | : March 10, 2015 | |
| INVENTOR(S) | : Yukinari Haraguchi et al. | |

It is certified that error appears in the above-identified patent and that said Letters Patent is hereby corrected as shown below:

On the title page, Item (73), should read:

-- (73) Assignee: Mitsubishi Chemical Corporation, Chiyoda-ku, (JP) --

Signed and Sealed this
Eighteenth Day of August, 2015

Michelle K. Lee
*Director of the United States Patent and Trademark Office*